(12) United States Patent
Sathyamurthy et al.

(10) Patent No.: US 12,167,564 B2
(45) Date of Patent: Dec. 10, 2024

(54) INTEGRATION OF AIRJETS INTO COMPUTING DEVICES

(71) Applicant: Frore Systems Inc., San Jose, CA (US)

(72) Inventors: Prabhu Sathyamurthy, San Jose, CA (US); Seshagiri Rao Madhavapeddy, La Jolla, CA (US); Nilesh Sudhir Hasabnis, Fremont, CA (US); Shekhar Halakatti, Campbell, CA (US); Varun Prasanna Rajamuthu, Sunnyvale, CA (US); Woo Sung Chung, Uiwang-si (KR); Suryaprakash Ganti, Los Altos, CA (US)

(73) Assignee: Frore Systems Inc., San Jose, CA (US)

( * ) Notice: Subject to any disclaimer, the term of this patent is extended or adjusted under 35 U.S.C. 154(b) by 173 days.

(21) Appl. No.: 17/983,289

(22) Filed: Nov. 8, 2022

(65) Prior Publication Data
US 2023/0137610 A1    May 4, 2023

Related U.S. Application Data

(63) Continuation-in-part of application No. 17/683,058, filed on Feb. 28, 2022, now Pat. No. 11,744,038.

(60) Provisional application No. 63/277,494, filed on Nov. 9, 2021, provisional application No. 63/220,371, filed on Jul. 9, 2021, provisional application No. 63/155,721, filed on Mar. 2, 2021.

(51) Int. Cl.
*H05K 7/20* (2006.01)
*G06F 1/20* (2006.01)

(52) U.S. Cl.
CPC ......... *H05K 7/20145* (2013.01); *G06F 1/203* (2013.01); *H05K 7/20154* (2013.01)

(58) Field of Classification Search
CPC ..... G06F 1/203; H01L 23/467; H01L 41/094; H05K 7/20145; H05K 7/20154; H05K 7/20172
See application file for complete search history.

(56) References Cited

U.S. PATENT DOCUMENTS 4,780,062 A   10/1988  Yamada
6,253,834 B1 *  7/2001  Sterner .............. H01L 23/467
                                              361/679.48
(Continued)

FOREIGN PATENT DOCUMENTS

EP   3327295 A1 *  5/2018  ............ F04B 45/047
EP   3327295        8/2021

*Primary Examiner* — Eric S Ruppert
*Assistant Examiner* — Hans R Weiland
(74) *Attorney, Agent, or Firm* — Van Pelt, Yi & James LLP

(57) ABSTRACT

A system including a module and an egress passageway is described. The module includes a cooling cells, a heat spreader, and a cover including vents therein. The cooling cells are between the heat spreader and the cover. Each of the cooling cells includes a cooling element configured to draw air in through the plurality of vents and drive air out of an aperture between the heat spreader and the cover at a first flow rate. A stream of hot air having been heated by a heat from a heat-generating structure thermally coupled to the heat spreader is thus provided. The hot air passes through the egress passageway toward an egress. The egress passageway includes at least one inlet through which cool air is drawn at a second flow rate to be mixed with the hot air. The second flow rate is greater than the first flow rate.

22 Claims, 16 Drawing Sheets

(56) References Cited

U.S. PATENT DOCUMENTS

| | | |
|---|---|---|
| 6,612,816 B1 | 9/2003 | Vanden Brande |
| 6,629,425 B2 | 10/2003 | Vaiyapuri |
| 7,282,837 B2 | 10/2007 | Scher |
| 7,553,135 B2 | 6/2009 | Cho |
| 7,972,124 B2 | 7/2011 | Hirata |
| 8,051,905 B2 | 11/2011 | Arik |
| 8,684,707 B2 | 4/2014 | Kanai |
| 10,440,860 B2 * | 10/2019 | Fricker .................... G06F 1/20 |
| 10,687,417 B2 | 6/2020 | Chen |
| 2005/0089415 A1 | 4/2005 | Cho |
| 2007/0076375 A1 * | 4/2007 | Mongia ................. F04B 45/047 |
| | | 257/714 |
| 2008/0062644 A1 | 3/2008 | Petroski |
| 2008/0089029 A1 | 4/2008 | Launay |
| 2008/0304979 A1 | 12/2008 | Lucas |
| 2011/0063800 A1 | 3/2011 | Park |
| 2011/0259557 A1 * | 10/2011 | Chao ................... F04B 43/046 |
| | | 417/413.1 |
| 2013/0050351 A1 | 2/2013 | Mardilovich |
| 2013/0258589 A1 | 10/2013 | Yu |
| 2013/0301218 A1 | 11/2013 | Li |
| 2014/0166235 A1 | 6/2014 | Hessling Von Heimendahl |
| 2014/0216696 A1 | 8/2014 | Donnelly |
| 2015/0173237 A1 | 6/2015 | Lin |
| 2016/0343637 A1 | 11/2016 | Axelrod |
| 2017/0276149 A1 | 9/2017 | Dusseau |
| 2017/0292537 A1 * | 10/2017 | Barak ..................... F04D 25/06 |
| 2018/0146544 A1 | 5/2018 | Chen |
| 2018/0168066 A1 * | 6/2018 | Xu ..................... H05K 7/20154 |
| 2018/0240733 A1 | 8/2018 | Chen |
| 2019/0101938 A1 | 4/2019 | Mou |
| 2020/0049386 A1 | 2/2020 | Ganti |
| 2020/0229320 A1 * | 7/2020 | Mou .................... A41D 13/002 |

* cited by examiner

INTEGRATION OF AIRJETS INTO COMPUTING DEVICES

CROSS REFERENCE TO OTHER APPLICATIONS

This application is a continuation in part of U.S. patent application Ser. No. 17/683,058 entitled EXHAUST BLENDING FOR PIEZOELECTRIC COOLING SYSTEMS filed Feb. 28, 2022, which claims priority to U.S. Provisional Patent Application No. 63/155,721 entitled MOUNTING AND USE OF PIEZOELECTRIC COOLING SYSTEMS IN DEVICES filed Mar. 2, 2021, U.S. Provisional Patent Application No. 63/220,371 entitled MEMS-BASED ACTIVE COOLING SYSTEMS INCLUDING COOLING CELL ARRANGEMENT, TABS, ANCHOR BONDING, INTEGRATED SPREADER, ADHESIVE, AND POWER MANAGEMENT filed Jul. 9, 2021, and U.S. Provisional Application No. 63/277,494 entitled INTEGRATION OF AIRJETS INTO COMPUTING DEVICES filed Nov. 9, 2021, all of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
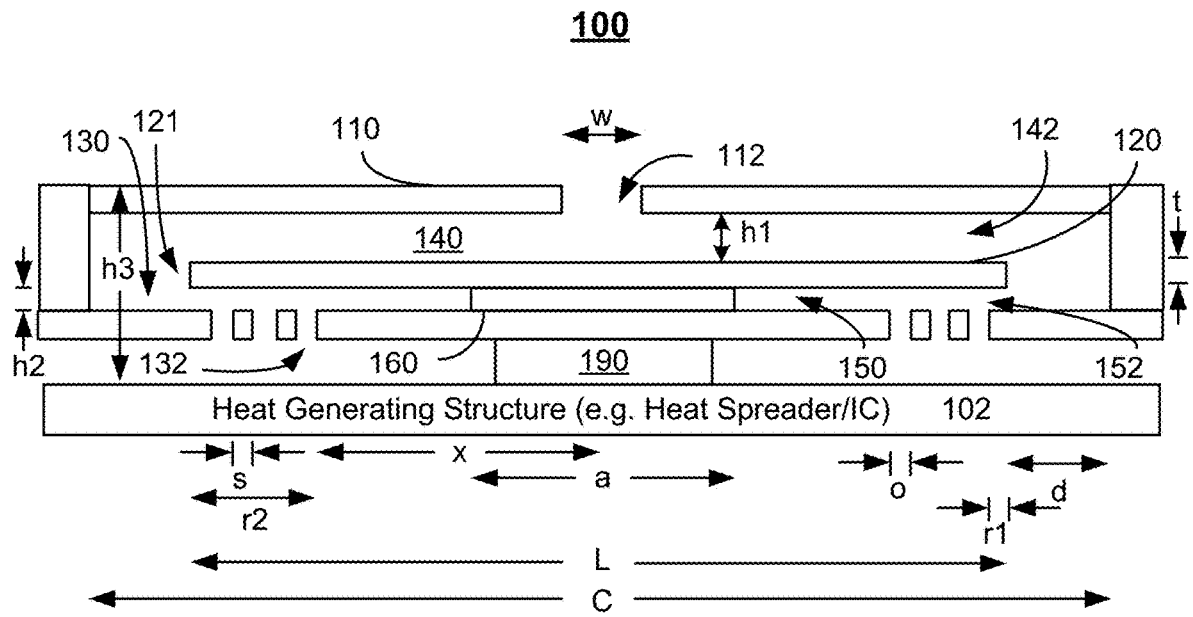
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. In addition, even if heat-generating components within a device may be actively cooled, the hot air or other fluid carrying the heat is desired to exit the device to carry the heat away from the device. This fluid is typically quite hot. For example, a processor may reach ninety through ninety-five degrees Celsius during operation. A heat spreader thermally coupled to the processor may be approximately seventy-eight through eighty degrees Celsius. Air used to cool such components may be hot enough when exiting the device that the air may cause the user discomfort and/or burn the user. Thus, thermal management is increasingly an issue for computing devices.

A system including a module and an egress passageway is described. The module includes a cooling cells, a heat spreader, and a cover including vents therein. The cooling cells are between the heat spreader and the cover. Each of the cooling cells includes a cooling element configured to draw air in through the vents and drive air out of an aperture between the heat spreader and the cover at a first flow rate. Thus, a stream of hot air having been heated by a heat from a heat-generating structure thermally coupled to the heat spreader is provided. The hot air passes through the egress passageway toward an egress. The egress passageway includes at least one inlet through which cool air is drawn at a second flow rate to be mixed with the hot air. The second flow rate is greater than the first flow rate. The cooling element undergoes vibrational motion to drive cooler air that is heated by the heat due to the heat-generating structure. In some embodiments, the module has a thickness not exceeding three millimeters. In some embodiments, the mixture of the hot air and the cool air at the egress has a temperature not exceeding sixty degrees Celsius for the heat-generating structure being at least seventy degrees Celsius. In some such embodiments, the temperature does not exceed fifty-five degrees Celsius.

The system may include a housing having the inlet(s) therein. The housing has a vertical dimension, a first horizontal dimension, and a second horizontal dimensions. The vertical dimension is smaller than the first horizontal dimension and second horizontal dimensions. The module is vertically aligned with a portion of the housing. The inlet(s) and/or egress are distal from the portion of the housing. In some embodiments, the housing includes a keyboard and a back cover opposite from the keyboard. The module may be at least one millimeter from the keyboard and at least 800 micrometers from the back cover. In some embodiments, the aperture has an aperture area, the egress has an egress area, and the aperture area does not exceed the egress area. In some embodiments, the module and the egress passageway are integrated into a computing device selected from a notebook computer, a laptop computer, and a smartphone.

In some embodiments, the module includes a top plate having vents therein and an orifice plate having at least one orifice therein for each cooling cell. A top chamber is formed between the cooling element and the top plate for each of the cooling cells. The cooling element is between the top plate and the orifice plate. The cooling element is actuated to drive air through the orifice(s). The orifice plate, the cooling element, the top chamber, and the top plate have a combined height of not more than two millimeters.

A method is also described. The method includes driving a cooling element in each of a plurality of cooling cells to induce a vibrational motion at a frequency. The cooling cells are part of a module. The module further includes a heat spreader, and a cover including vents therein. The cooling cells are between the heat spreader and the cover. The vibrational motion draws air in through the vents and drives the air out of an aperture between the heat spreader and the cover at a first flow rate. Thus, a stream of hot air heated by a heat from a heat-generating structure thermally coupled to the heat spreader is provided. The hot air passes through an egress passageway toward an egress. The egress passageway includes at least one inlet through which cool air is drawn and provides a second flow rate to be mixed with the hot air. The second flow rate is greater than the first flow rate. In some embodiments, the frequency corresponds to a structural resonant frequency of the cooling element and an acoustic resonant frequency for the cooling element. The module may have a thickness not exceeding three millimeters. In some embodiments, a mixture of the hot air and the cool air at the egress has a temperature not exceeding fifty-five degrees Celsius for the heat-generating structure being at least seventy degrees Celsius.

Figure 1B:
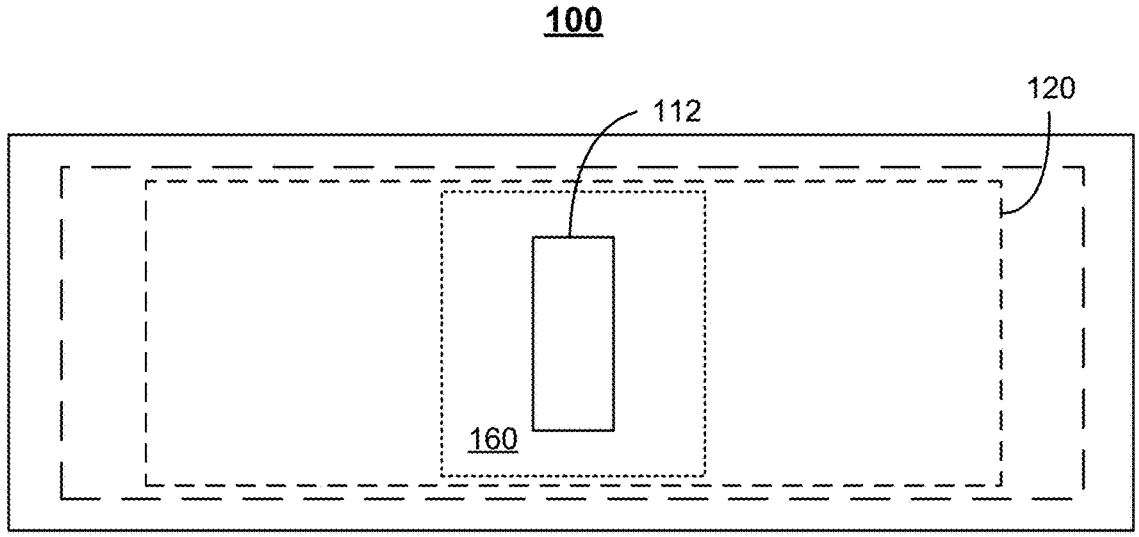
Figure 1C:
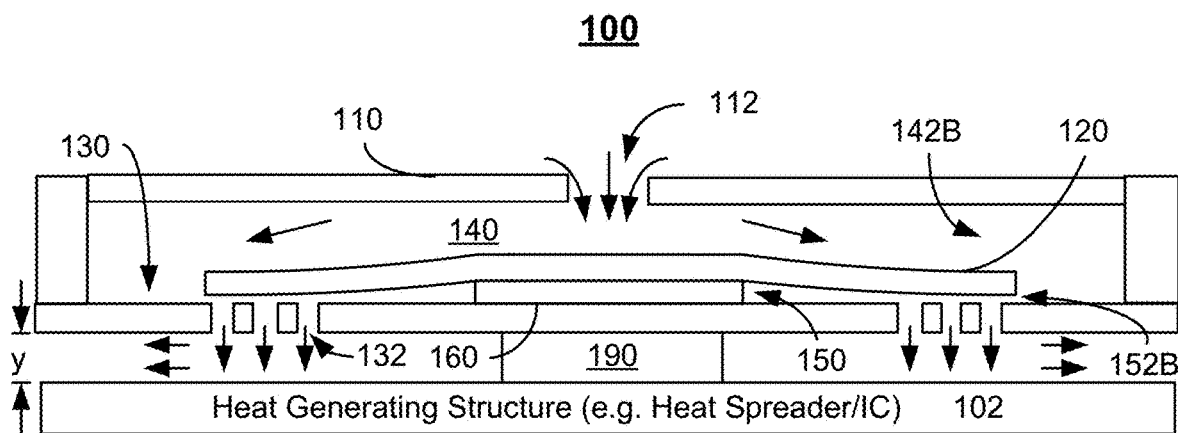
Figure 1D:
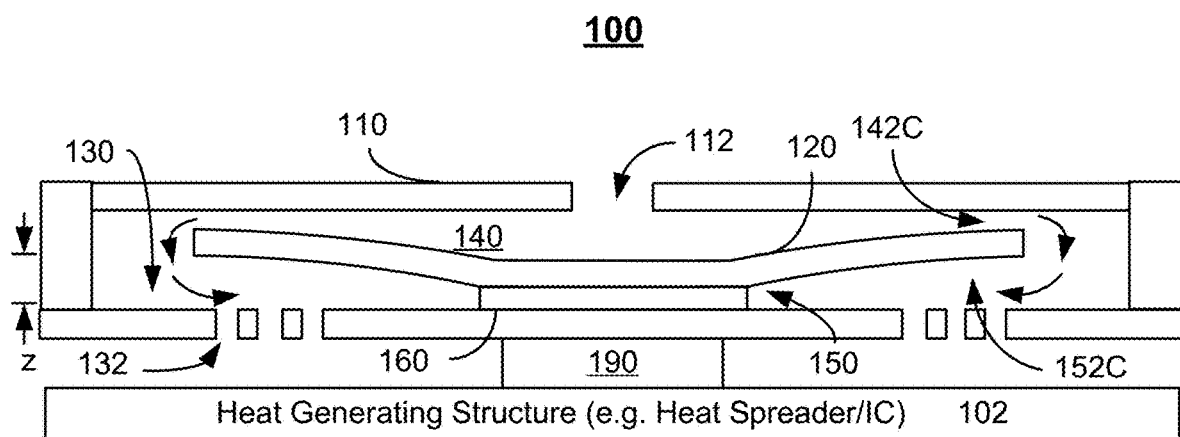
Figure 1E:
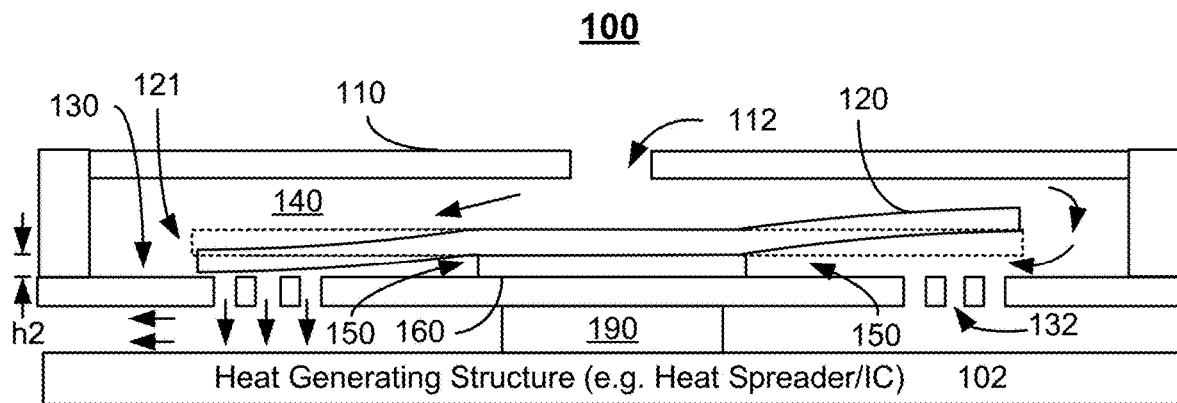
Figure 1F:
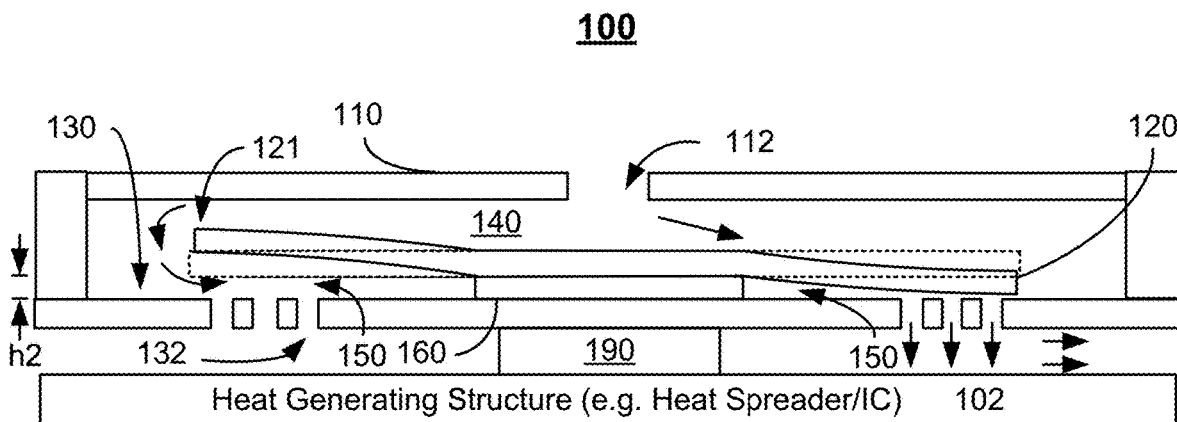
Figure 1G:
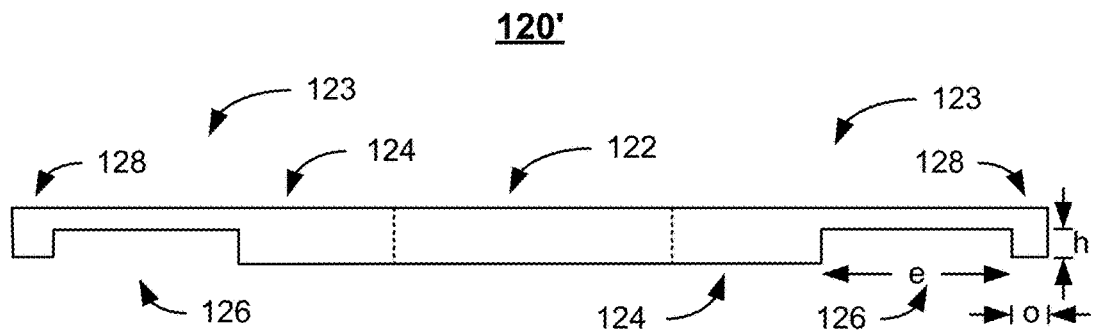

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, $\nu$, is at or near the structural resonant frequency for cooling element 120. The frequency $\nu$ is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or a Ti (e.g. a Ti alloy such as Ti6Al-4V). In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz (e.g. 23 kHz-25 kHz). The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
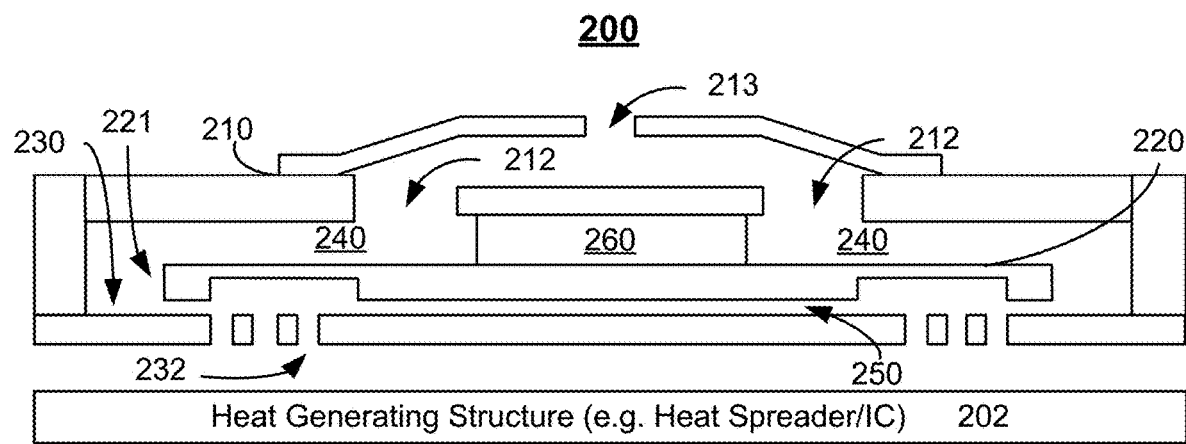
FIGS. 2A-2B depict an embodiment of an active MEMS cooling system including a centrally anchored cooling element.
Figure 2B:
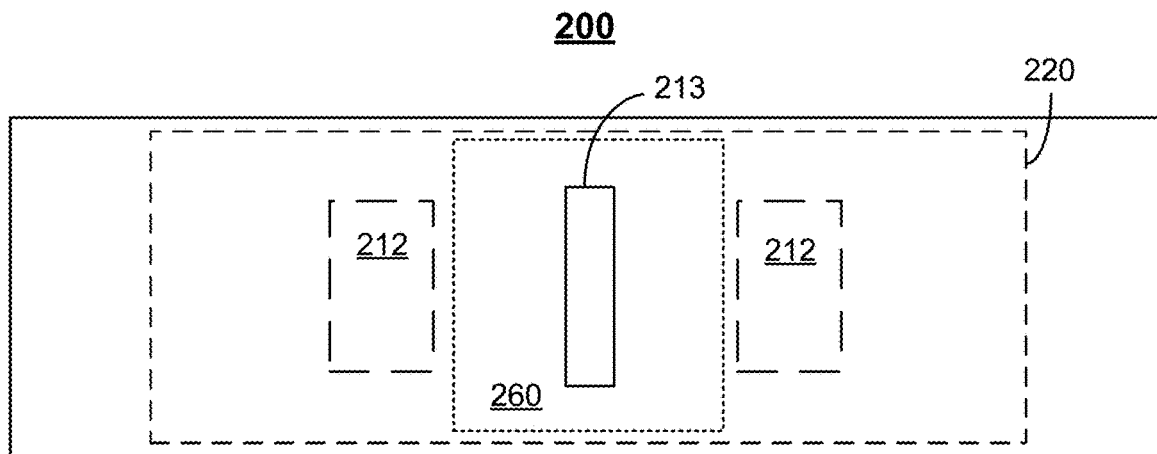

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 202.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 420. In other embodiments, anchor 460 is only near the center portion of cooling element 420. Although not explicitly labeled in FIGS. 2A and 2B, cooling element 220 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown), may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
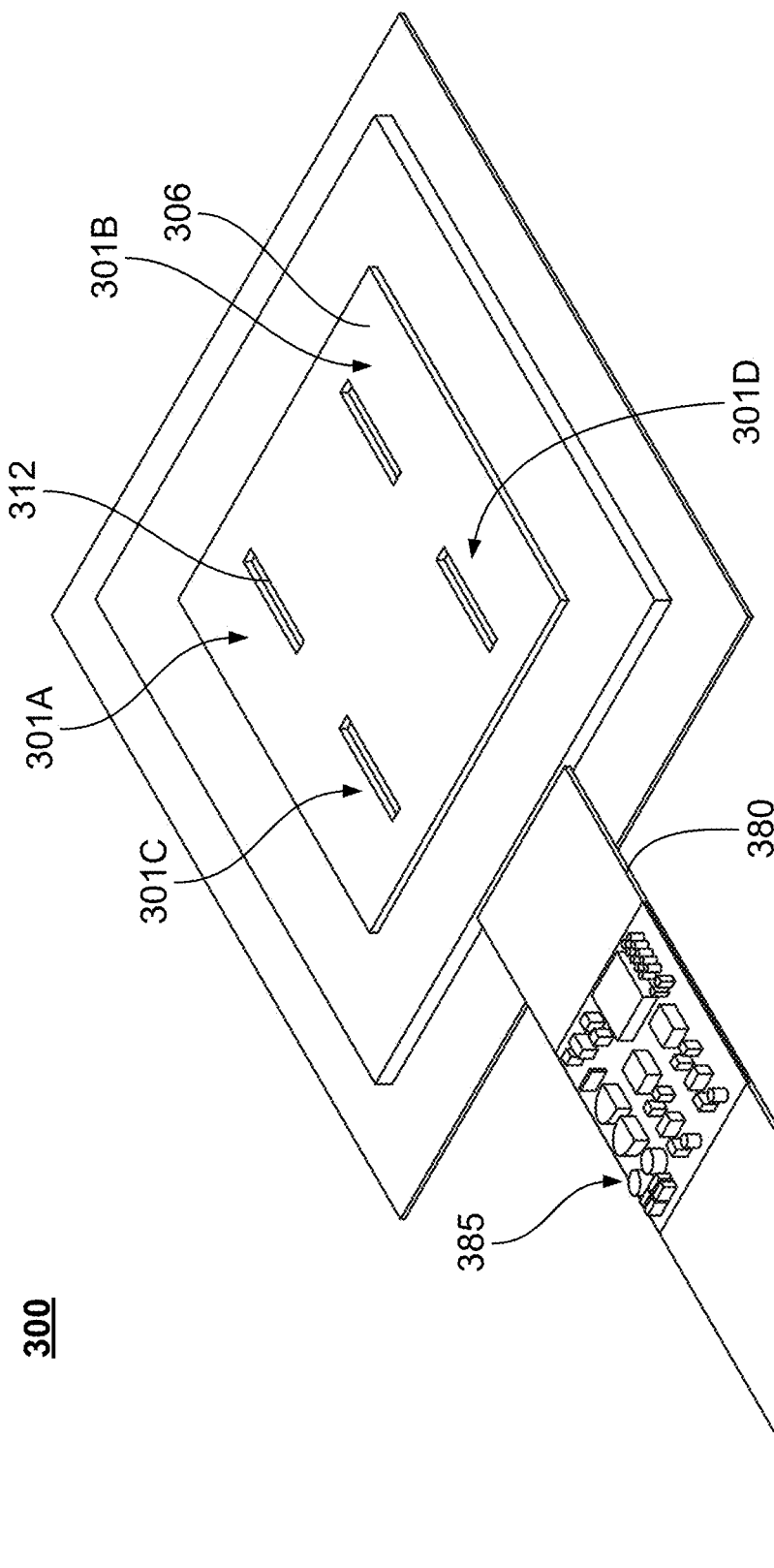
FIGS. 3A-3G depict an embodiment of an active MEMS cooling system formed in a tile.
Figure 3B:
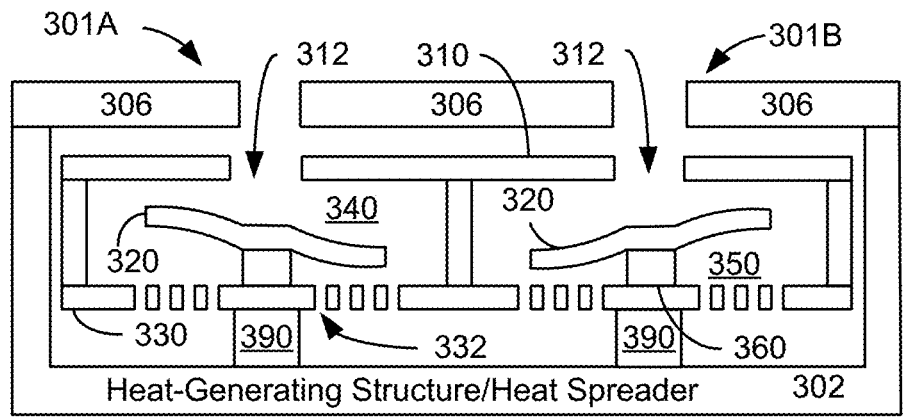
Figure 3C:
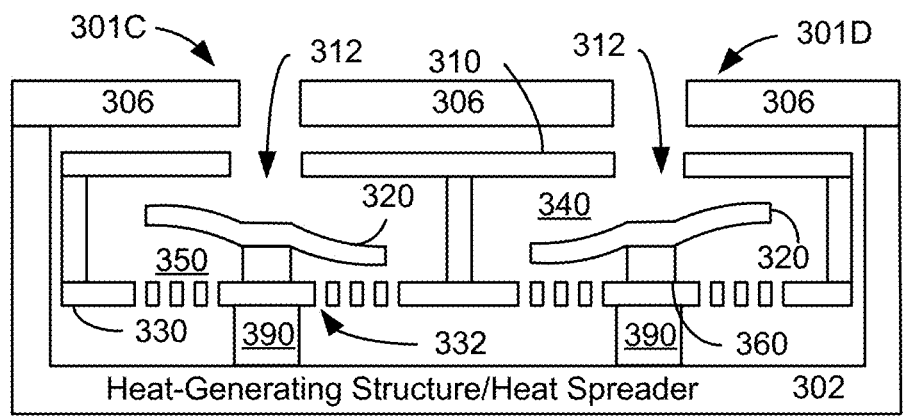
Figure 3D:
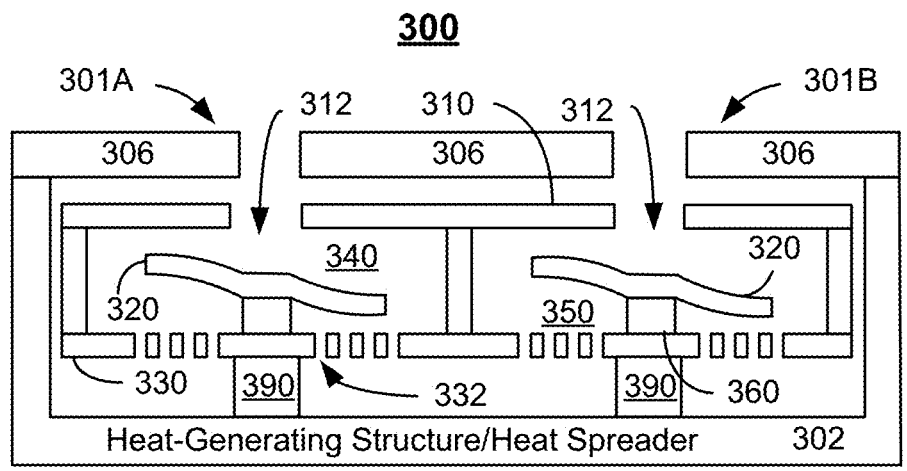
Figure 3E:
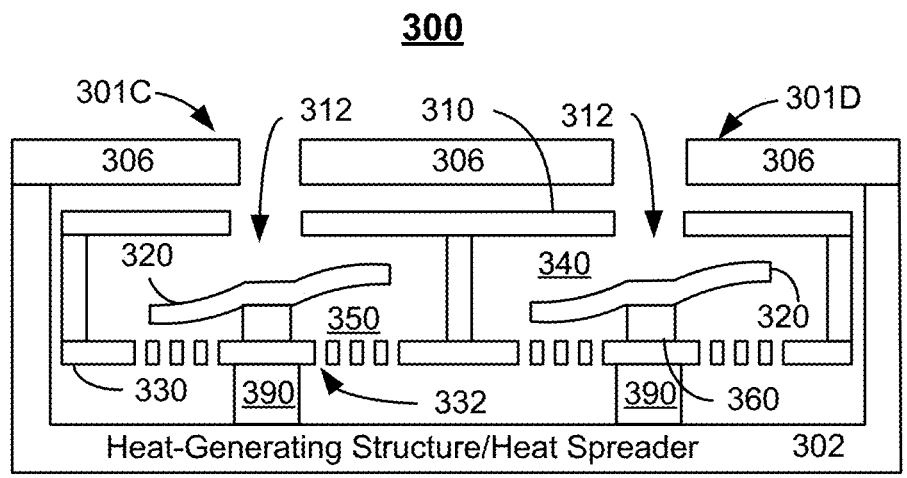
Figure 3F:
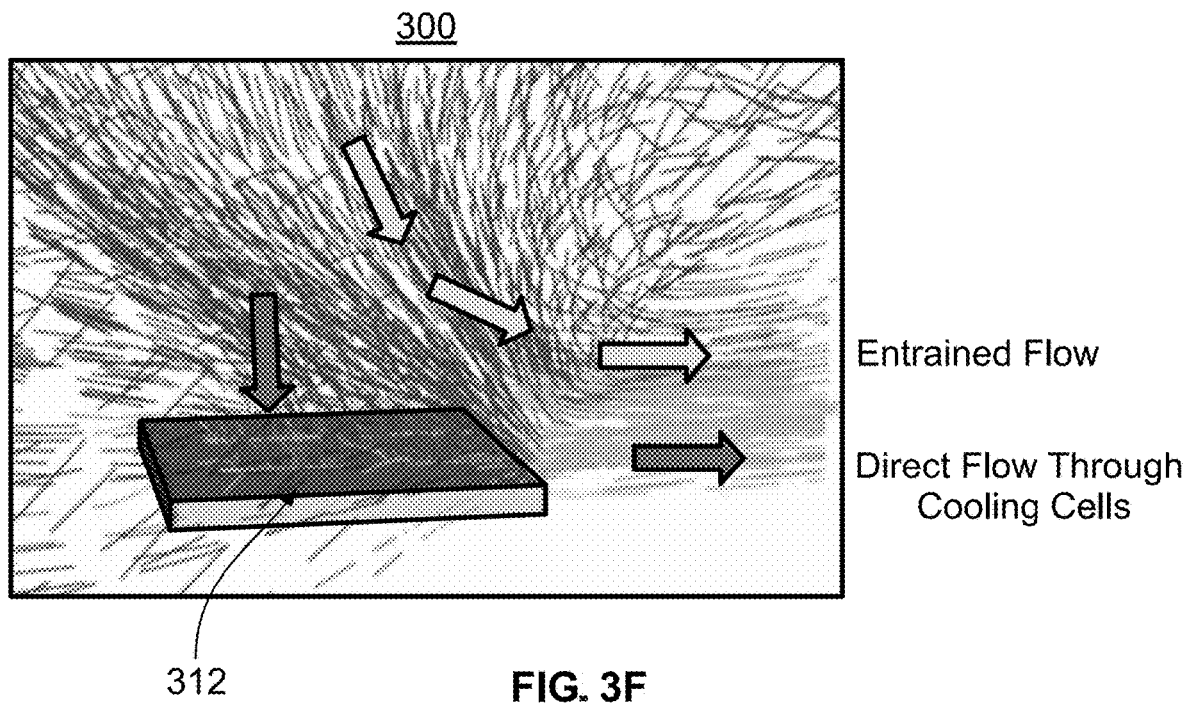
Figure 3G:
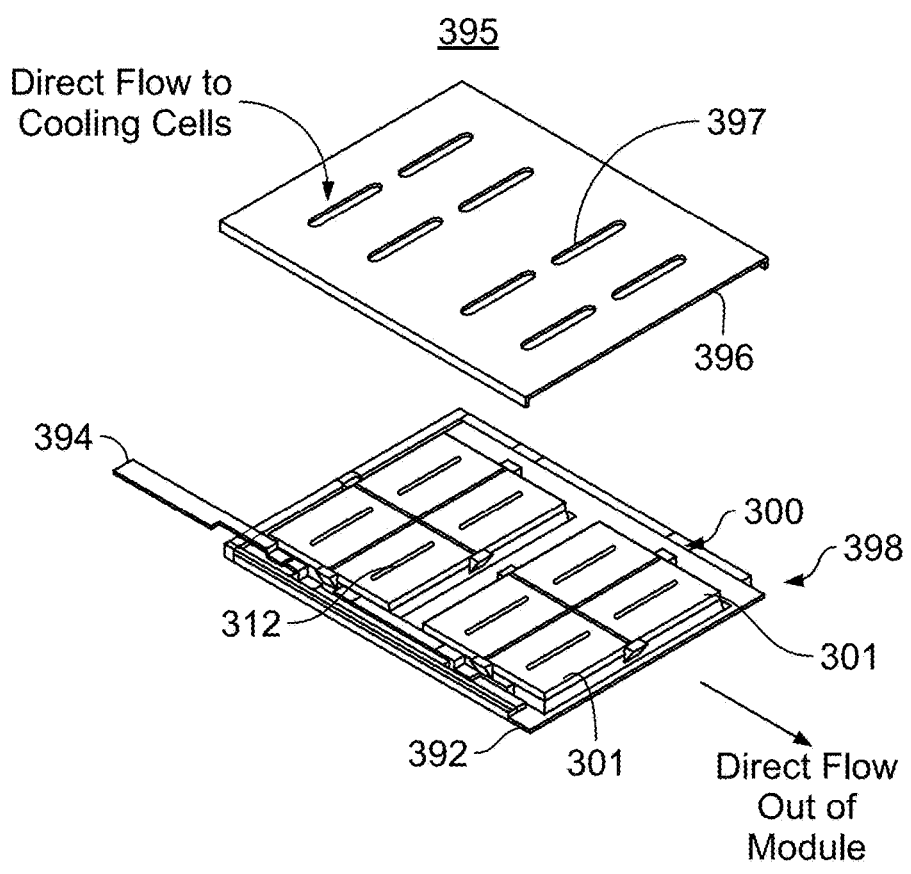

FIGS. 3A-3G depict an embodiment of active MEMS cooling system 300 including multiple cooling cells configured as a module termed a tile, or array. FIG. 3A depicts a perspective view, while FIGS. 3B-3E depict side views. FIG. 3G indicates the flow of a fluid, such as air, during use of cooling system 300. FIG. 3G depicts module 395 including multiple cooling systems 300. FIGS. 3A-3G are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360, may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-3G) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments. FIG. 3F indicates the flow of a fluid, such as air, driven by the cooling elements of cooling system 300. As discussed herein, cooling system 300 not only drives direct flow of the fluid (e.g. air) through the cooling cells 310, but also entrains fluid from nearby regions. In particular, the entrained air flow may be substantially the same as or exceed the direct fluid flow. Thus, as indicated in the embodiment shown in FIG. 3F, operation of the cooling cell may result in more fluid flow being entrained than directly driven.

In some embodiments, two sets of four cooling cells 301 may be combined and integrated in a manner analogous to system 300. FIG. 3G is an exploded view of module 395 including two cooling systems 300 and, therefore, eight cooling cells 301. Cooling system 300 are enclosed in copper heat spreader 392 and cover 396 having vents 397 therein. Also shown is connector 396 that may house drive electronics analogous to drive electronics 385. Although not shown, vents 397 may have a dust cover that reduces or prevents the flow of dust (e.g. carried by the fluid flowing into vents 397) from reaching the internal portion of module 395 Such standardized modules 395 may facilitate incorporation into devices. Aperture 398 through which flow exits module 395 is between cover 396 and heat spreader 392. In some embodiments, aperture 398 occupies most or all of the side of module 395. In some embodiments, module 395 may be approximately forty to sixty millimeters on a side (e.g. forty-five millimeters by fifty-five millimeters) and not more than three millimeters thick. Module 395 may be capable of dissipating 10 W of power (while consuming not more than approximately 3 W of power). Direct flow through module 395 may be at least 0.3 cfm (e.g. on the order of 0.35 cfm) and entrained flow may be at least 0.5 cfm (e.g. 0.7 cfm or approximately twice the direct flow). Thus, the entrained airflow achieved using module 395 is at least the same as the direct airflow. In some embodiments, the entrained airflow is at least 1.5 multiplied by the direct airflow through module 395. In some embodiments, the entrained airflow may be twice the direct airflow through module 395. At such flows, the back pressure for module 395 may be not more than 2 kPa-2.2 kPa. Further, module 395 may have a top surface temperature that is significantly lower than the heat spreader (not shown in FIG. 3G) to which module 395 is coupled or heat spreader 392. This occurs because the active heat dissipation of module 395 starts from the region the fluid enters vents 397 opposite to heat spreader 392. Consequently, during operation the top surface of module 395 may be at least ten degrees Celsius cooler than a heat spreader 392 or other component to which module 395 is thermally coupled via heat spreader 392. In some embodiments, the top surface of module 395 is at least fifteen degrees Celsius cooler than heat spreader 392 during operation. The thin form factor (e.g. less than three millimeters thick), high back pressure and flow, little to no noise (e.g. less than 27 dBA) and low top surface temperature may facilitate use of module 395 in devices including but not limited to notebook computers. Thus, the techniques and systems described herein include but are not limited to use in notebook computers.

Cooling cells 301 of cooling system 300 and module 395 functions in an analogous manner to cooling system(s) 100, 200, and/or an analogous cooling system. Consequently, the benefits described herein may be shared by cooling system 300 and module 395. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4:
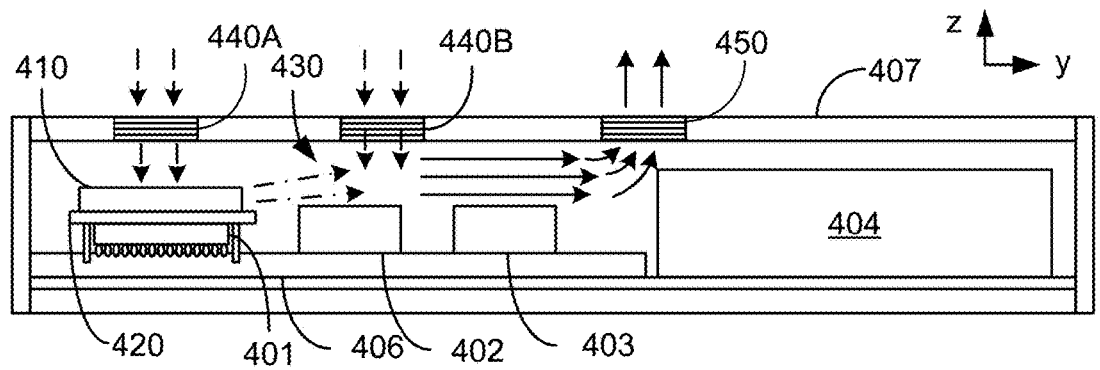
FIG. 4 depicts an embodiment of an active cooling system that utilizes entrainment integrated into a device.

FIG. 4 depicts an embodiment of active cooling system 400 that utilizes entrainment as integrated into a device.

FIG. 4 is not to scale and for clarity, only some structures are shown. The device may be a laptop computer, a tablet or notebook computer, a smart phone, and/or other mobile device. Device may also be another device, such as a server in a rack, a game console, or a desktop computer. In some embodiments, therefore, the device is thin. For example, in some embodiments, the device has a thickness (height along the smallest dimension, the z-direction in FIG. 4) of not more than twenty-five millimeters. The thickness is not more than ten millimeters in some embodiments. In some such embodiments, the thickness of the device is not more than eight millimeters. However, other thicknesses are possible.

The device into which cooling system 400 is integrated includes heat-generating structure 401, additional components 402, 403, and 404, substrate 406, and housing 407. Heat-generating structure 401 is a component that is desired to be cooled. For example, heat-generating structure 401 may be an integrated circuit, such as a processor, or other device. During use, heat-generating structure 401 may rise significantly in temperature. For example, for heat-generating structure 402 being a processor, the top near heat spreader 420 may be on the order of ninety degrees Celsius and the junction temperature may be on the order of ninety-three to ninety four degrees Celsius. Substrate 406 may be a printed circuit board (PCB) or other substrate on which heat-generating structure 401 and additional components 402 and 403 are mounted. In some embodiments, substrate 404 may be omitted. Components 402, 403, and 404 may also generate heat. Thus, cooling system 400 may be used for thermal management of not only heat-generating structure 401, but also components 402, 403, and/or 404.

Cooling system 400 includes MEMS cooling system 410, heat spreader 420, egress passageway 430, inlets 440A and 440B (collectively or generically 440), and egress 450. In some embodiments, heat spreader 420 may be omitted and/or another structure used to mount MEMS cooling system 410. MEMS cooling system 410 includes one or more cooling cells analogous to cooling systems 100 and/or 200. In some embodiments, MEMS cooling system 410 includes multiple cooling cells configured as a module termed a tile. For example, MEMS cooling system 410 may include one or more tiles 300 and/or module 395. Thus, MEMS cooling system 410 includes cooling element(s) configured to undergo vibrational motion when actuated to drive a fluid. MEMS cooling system 410 may also include top plate(s), anchor(s), orifice plate(s), and/or pedestal(s) analogous to those described in the context of cooling system 100 and/or 200. MEMS cooling system 410 may also include an integrated heat spreader and cover analogous to those described in the context of tile 300. MEMS cooling system 410 may have a thickness of not more than three millimeters. In some embodiments, MEMS cooling system 410 has a thickness of not more than 2.5 millimeters. MEMS cooling system 410 may have a thickness of not more than two millimeters.

Inlets 440A and 440B and egress 450 allow for an exchange in fluid (e.g. air) internal to housing 407 with fluid external to the device. For example, inlets 440A and 440B and egress 450 may be vents. Although two inlets 440A and 440B and one egress 450 are shown, in some embodiments, another number of inlet(s) and/or egress(es) may be present. Although termed inlets, inlet(s) 440A and/or 440B may allow some fluid to exit the device. Similarly, although termed an egress, egress 450 may allow some fluid to enter the device. Thus, the terms inlet and egress are intended to indicate the primary function of the structures 440A, 440B, and 450.

In the embodiment shown, fluid entering the device via inlet 440A and driven via MEMS cooling system 410 primarily flows through MEMS cooling system 410. Thus, fluid may enter via inlet 440A, enter MEMS cooling system 410 via apertures (not shown in FIG. 4), be driven through MEMS cooling system 410 by vibrational motion of cooling elements (not shown in FIG. 4), and exit MEMS cooling system 410. More specifically, cooler fluid enters via inlet 440A. This flow of cooler fluid is shown by dashed arrows. The cool fluid may be the temperature of the ambient in which the device operates. For example, the cool fluid may be at or near room temperature (e.g. 22-28 degrees Celsius). Heat from heat-generating structure 401 is transferred to heat spreader 420 (e.g. via conduction) and from heat spreader 420 to the fluid driven through MEMS cooling system 410. In traversing MEMS cooling system 410, the fluid is heated. Thus, hot fluid exits MEMS cooling system 410. The flow of heated fluid is shown by the dotted/dashed arrows in FIG. 4. In some embodiments, the heated fluid exiting MEMS cooling system 410 has a temperature of at least sixty degrees Celsius. In some embodiments, the heated fluid exiting MEMS cooling system 410 is at least sixty-five degrees Celsius. In some embodiments, the heated fluid exiting MEMS cooling system 410 is at least seventy degrees Celsius.

As described herein, the heated fluid driven by MEMS cooling system 410 travels at high speeds. For example, fluid leaving the orifice plate may travel at the speeds described herein (e.g. greater than thirty-five meters per second). The flow of heated fluid outside of MEMS cooling system 410 is also at a high speed. Consequently, a region of low pressure may be developed within egress passageway 430. The low pressure and/or high fluid flow of egress passageway 430 due to MEMS cooling system 410 entrains fluid into inlet 440B. Stated differently, fluid is drawn into egress passageway 430 from inlet 440B. In the embodiment shown, the entrained fluid is from the ambient and thus may have a temperature similar to the fluid drawn into inlet 440A. The flow of cooler fluid into inlet 440B is indicated by dashed arrows in FIG. 4. The flow of cool fluid through inlet 440B is at least one-half multiplied by the fluid flow from MEMS cooling system 410. In some embodiments, the flow of cool fluid through inlet 440B is at least as large as the fluid flow from MEMS cooling system 410. The flow of cool fluid from inlet 440B in egress passageway 430 may be greater than the flow of fluid through MEMS cooling system 410. In some embodiments, the flow of cool fluid from inlet 440B in egress passageway 430 is at least 1.5 multiplied by the flow of fluid through MEMS cooling system 410. In some embodiments, the flow of cool fluid from inlet 440B in egress passageway 430 is at least two multiplied by the flow of fluid through MEMS cooling system 410.

Egress passageway 430 receives hot fluid from MEMS cooling system 410 and the cool fluid from inlet 440B. The hot fluid from MEMS cooling system 410 mixes with the cooler fluid from inlet 440B in egress passageway 430. Thus, the hot fluid from MEMS cooling system 410 is cooled. The flow of the mixture of the heated fluid from MEMS cooling system 410 and cool fluid from inlet 440B is shown by solid arrows in FIG. 4. The mixture of heated and cool fluid exits egress passageway via egress 450. Because cool fluid is mixed with hot fluid in egress passageway 430, the mixture of fluid exiting via egress 450 may have a significantly lower temperature than the hot fluid leaving MEMS cooling system 410. For example, the mixture of the hot air and the cool air at egress 450 may have a temperature not exceeding sixty degrees Celsius for the heat-generating structure being at least seventy degrees Celsius (e.g. for the heat-generating component having a temperature of at least ninety degrees Celsius). In some embodiments, the temperature of the fluid mixture at egress 450 does not exceed fifty-five degrees Celsius. For example, the mixture of fluid may have a temperature of at least fifty and not more than fifty-five degrees Celsius. In some embodiments, the temperature at egress 450 may be lower. For example, the fluid mixture exiting the device via egress 450 may be forty through forty-five degrees Celsius.

In addition to cooling the hot fluid from MEMS cooling system 410, the cool air entrained through inlet 440B may also be used to cool other components. Stated differently, the cool(er) air entering via inlet 440B may pass and remove heat from other components. For example, components 402, 403, and/or 404 might be cooled.

Cooling system 400 may improve thermal management of the device(s) in which cooling system 400 is incorporated. MEMS cooling system 410 may provide efficient cooling in a low profile package. For example, in some embodiments, MEMS cooling system 410 may provide up to ten Watts of power dissipation while consuming three Watts of power. Further, MEMS cooling system 410 is thin (e.g. MEMS cooling system 410 is not more than three millimeters thick). Thus, cooling system 400 may be used in confined spaces and thin devices. Further, entrainment provided via egress passageway 430 may provide higher flow and greater cooling. In addition, fluid used in cooling the device exits the device at a lower temperature. For example, fluid exiting egress 450 may be 50-55 degrees Celsius in some cases. Thus, the fluid is less likely to cause discomfort to or burn a user. Thus, performance of devices incorporating cooling system 400 may be improved.

FIGS. 5A-5F depict embodiments of active cooling system 500A, 500B, 500C, 500D, 500E and 500F that utilize MEMS cooling systems and, optionally, entrainment as integrated into devices. FIGS. 5A-5F are not to scale and for clarity, only some structures are shown. The device in each cooling system 500A, 500B, 500C, 500D, 500E and 500F may be a laptop computer, a tablet or notebook computer, a smart phone, and/or other mobile device. Device may also be another device, such as a server in a rack, a game console, or a desktop computer. In some embodiments, therefore, the device is thin. For example, in some embodiments, the device has a thickness (height along the smallest dimension, the z-direction in FIGS. 5A-5F) of not more than twenty-five millimeters. The thickness is not more than twenty millimeters in some embodiments. The thickness is not more than fifteen millimeters in some embodiments. The thickness is not more than ten millimeters in some embodiments. In some such embodiments, the thickness of the device is not more than eight millimeters. However, other thicknesses are possible.

Cooling system 500A and the device into which it is incorporated are analogous to cooling system 400 and the device housing cooling system 400. The device into which cooling system 500A is integrated includes heat-generating structure 501, additional components 502 and 503, substrate 506, housing 507 and 508 that are analogous to heat-generating structure 401, additional components 402 and 403, substrate 406, and housing 407. The portion of housing 507 includes a keyboard, while portion housing 508 is near the support (e.g. a table or other structure) on which the device is located. Heat-generating structure 501 is a component that is desired to be cooled, such as a processor. During use, heat-generating structure 501 may reach temperatures analogous to those described in the context of heat-generating structure 401. Also shown is thermal interface material (TIM) 509 that may be used to improve thermal coupling between heat-generating structure 501 and heat spreader 520. In some embodiments, TIM 509 may be omitted. Components 502 and 503 may also generate heat. Thus, cooling system 500A may be used for thermal management of not only heat-generating structure 501, but also components 502 and/or 503.

Cooling system 500A includes MEMS cooling system 510, heat spreader 520, egress passageway 530, inlets 540A and 540B (collectively or generically 540), and egress 550 that are analogous to cooling system 410, heat spreader 420, egress passageway 430, inlets 440, and egress 450, respectively. MEMS cooling system 510 includes cooling cells 512 and surrounding structure 514 which may be analogous to cooling cells 301, heat spreader 302, and cover plate 306. Thus, MEMS cooling system 510 may correspond to one or more modules 395 or cooling systems 300. In some embodiments, heat spreader 520 may be omitted and/or another structure used to mount MEMS cooling system 510. In some embodiments, heat spreader 520 may be part of structure 514 surrounding cooling cells 512. In some embodiments, heat spreader 520 may be considered to be integrated into MEMS cooling system 510. Although a single set of cooling cells 512 and surrounding structure 514 (e.g. a tile) is shown, multiple tiles may be present in some embodiments. Thus, MEMS cooling system 510 (i.e. cooling cells 512) includes cooling element(s) configured to undergo vibrational motion when actuated to drive a fluid. Cooling cells 512 may also include top plate(s), anchor(s), orifice plate(s), and/or pedestal(s) analogous to those described in the context of cooling system 100 and/or 200. MEMS cooling system 510 may have a thickness of not more than three millimeters. MEMS cooling system 510 may have a thickness of less than three millimeters. In some embodiments, MEMS cooling system 510 has a thickness of not more than 2.5 millimeters. MEMS cooling system 510 have a thickness of not more than two millimeters.

Inlets 540A and 540B and egress 550 allow for an exchange in fluid (e.g. air) internal to housing 507 with fluid external to the device. For example, inlets 540A and 540B and egress 550 may be vents. Although two inlets 540A and 540B and one egress 550 are shown, in some embodiments, another number of inlet(s) and/or egress(es) may be present. The function of inlets 540A and 540B and egress 550 are analogous to that of inlets 440A and 440B and egress 450, respectively.

Cooling system 500A functions in a manner analogous to cooling system 400. In the embodiment shown, fluid (e.g. air) enters the device from the region between housing 508 and the underlying support. Thus, cool fluid enters the device via inlet 540A and primarily flows through MEMS cooling system 510. The cool fluid may be the temperature of the ambient in which the device operates (e.g. 22-28 degrees Celsius). This flow of cooler fluid is shown by dashed arrows. The cool fluid is driven via cooling cells 512 of MEMS cooling system 510. In so doing, heat is transferred from heat-generating structure 501 (via heat spreader 520) to the fluid. The heated fluid flows between portions of surrounding structure 514, toward egress 550. The flow of heated fluid is shown by dotted/dashed arrows. In some embodiments, the heated fluid exiting MEMS cooling system 510 has a temperature of at least sixty degrees Celsius. In some embodiments, the heated fluid exiting MEMS cooling system 510 is at least sixty-five degrees Celsius. In some embodiments, the heated fluid exiting MEMS cooling system 510 is at least seventy degrees Celsius.

The heated fluid driven by MEMS cooling system 510 travels at high speeds discussed herein. Consequently, a region of low pressure may be developed within egress passageway 530. The low pressure and/or high fluid flow of egress passageway 530 due to MEMS cooling system 510 entrains fluid into inlet 540B. In the embodiment shown, the entrained fluid is from the ambient and thus may have a temperature similar to the fluid drawn into inlet 540A. The flow of cooler fluid into inlet 540B is indicated by dashed arrows in FIG. 5A. The flow of cool fluid through inlet 540B is at least one-half multiplied by the fluid flow from MEMS cooling system 510. In some embodiments, the flow of cool fluid through inlet 540B is at least as large as the fluid flow from MEMS cooling system 510. The flow of cool fluid from inlet 540B in egress passageway 530 may be greater than the flow of fluid through MEMS cooling system 510. In some embodiments, the flow of cool fluid from inlet 540B in egress passageway 530 is at least 1.5 multiplied by the flow of fluid through MEMS cooling system 510. In some embodiments, the flow of cool fluid from inlet 540B in egress passageway 530 is at least two multiplied by the flow of fluid through MEMS cooling system 510.

Egress passageway 530 receives hot fluid from MEMS cooling system 510 and the cool fluid from inlet 540B. The hot fluid from MEMS cooling system 510 mixes with the cooler fluid from inlet 540B in egress passageway 530. Thus, the hot fluid from MEMS cooling system 510 is cooled. The flow of the mixture of the heated fluid from MEMS cooling system 510 and cool fluid from inlet 540B is shown by solid arrows in FIG. 5A. The mixture of heated and cool fluid exits egress passageway via egress 550. Because cool fluid is mixed with hot fluid in egress passageway 530, the mixture of fluid exiting via egress 550 may have a significantly lower temperature than the hot fluid leaving MEMS cooling system 510. For example, the mixture of the hot air and the cool air at egress 550 may have a temperature not exceeding sixty degrees Celsius for the heat-generating structure being at least seventy degrees Celsius (e.g. for the heat-generating component having a temperature of at least ninety degrees Celsius). In some embodiments, the temperature of the fluid mixture at egress 550 does not exceed fifty-five degrees Celsius. For example, the mixture of fluid may have a temperature of at least fifty and not more than fifty-five degrees Celsius. In some embodiments, the temperature at egress 550 may be lower. For example, the fluid mixture exiting the device via egress 550 may be forty through forty-five degrees Celsius.

In addition to cooling the hot fluid from MEMS cooling system 510, the cool air entrained through inlet 540B may also be used to cool other components. Stated differently, the cool(er) air entering via inlet 540B may pass and remove heat from other components. For example, components 502 and/or 503 might be cooled. In some embodiments, other mechanisms are used to cool component(s) 502 and/or 503. In some embodiments, no additional thermal management is used for component(s) 502 and/or 503.

Figure 5A:
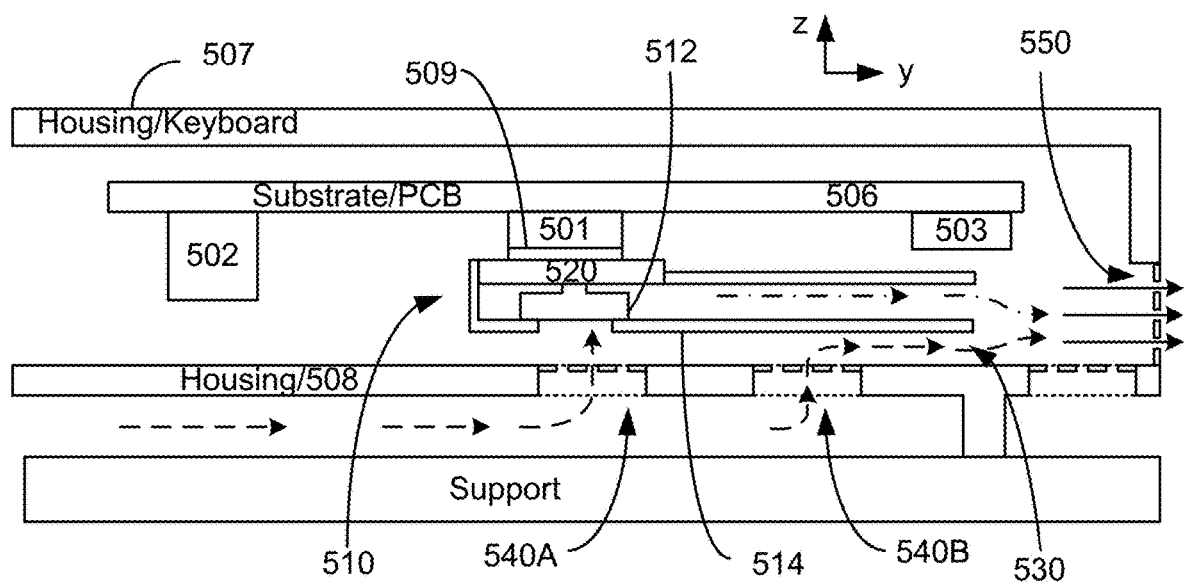
FIGS. 5A-5F depict embodiments of an active cooling system that may utilize entrainment integrated into a device.
Figure 5B:
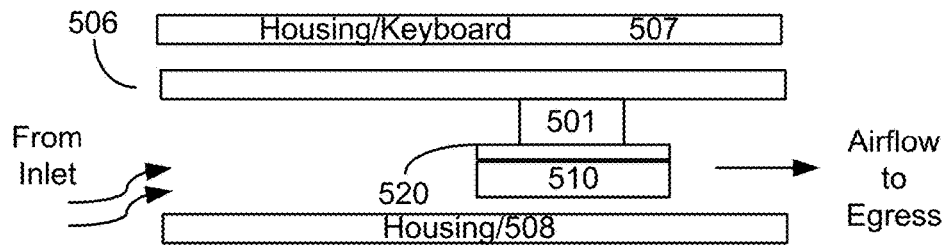

Referring to FIG. 5B, cooling system 500B and the device (e.g. a notebook computer or other portable computing device) into which it is incorporated are analogous to cooling systems 400 and 500A and the device housing cooling system 400 and 500A. The device into which cooling system 500B is integrated includes heat-generating structure 501 (e.g. a central processing unit), additional components (not shown in FIG. 5B), substrate 506, housing 507 (e.g. having a keyboard) and 508 (e.g. back cover) that are analogous to heat-generating structure 401/501, additional components 402/502 and 403/503, substrate 406/506, and housing 407/507. During use, heat-generating structure 501 may reach temperatures analogous to those described in the context of heat-generating structure 401. Although not shown, a TIM may be used to improve thermal coupling between heat-generating structure 501 and heat spreader 520 and/or MEMS cooling system 510.

Cooling system 500B includes MEMS cooling system 510, which is analogous to MEMS cooling system 510 depicted in FIG. 5A. Thus, MEMS cooling system 510 may be a module analogous to module 395. In some embodiments, MEMS cooling system 510 may include multiple modules 395. MEMS cooling system 510 is coupled directly to (i.e. aligned with) heat-generating structure 501 via heat spreader 520. For example, heat spreader 392 of module 395 of MEMS cooling system 510 may be coupled with heat spreader 520. In some embodiments, heat spreader 520 may be formed of a layer of graphite and a layer of copper (e.g. a 500 micrometer thick layer of copper with a 100 micrometer thick layer of graphite). In other embodiments, for example embodiments in which MEMS cooling system 510 includes multiple modules 395, item 320 may be a vapor chamber.

Directly coupling MEMS cooling system 510 to heat-generating structure 501 may reduce complexity of design and thermal resistance between heat-generating structure 501 and MEMS cooling system 510. As discussed with respect to module 395, the surface of MEMS cooling system 510 opposite to heat-generating structure 501 may be significantly cooler than heat spreader 520. Thus, a lower temperature of back cover of housing 508 may be maintained.

Figure 5C:
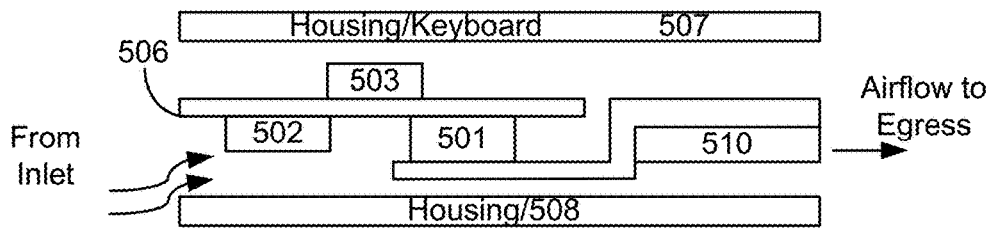

Referring to FIG. 5C, cooling system 500C and the device (e.g. a notebook computer or other portable computing device) into which it is incorporated are analogous to cooling systems 400, 500A, and 500B and the device housing cooling system 400, 500A, and 500B. The device into which cooling system 500C is integrated includes heat-generating structure 501 (e.g. a central processing unit), additional components 502 and 503, substrate 506, housing 507 (e.g. having a keyboard) and 508 (e.g. back cover) that are analogous to heat-generating structure 401/501, additional components 402/502 and 403/503, substrate 406/506, and housing 407/507. During use, heat-generating structure 501 may reach temperatures analogous to those described in the context of heat-generating structure 401. Although not shown, a TIM may be used to improve thermal coupling between heat-generating structure 501 and heat spreader 520 and/or MEMS cooling system 510.

Cooling system 500C includes MEMS cooling system 510, which is analogous to MEMS cooling system 510 depicted in FIG. 5A. Thus, MEMS cooling system 510 may be a module analogous to module 395. In some embodiments, MEMS cooling system 510 may include multiple modules 395. MEMS cooling system 510 is offset from (i.e. not directly aligned with) heat-generating structure 501. However, MEMS cooling system 510 is still thermally coupled with heat-generating structure 501 via heat spreader 520. For example, heat spreader 392 of module 395 of MEMS cooling system 510 may be coupled with heat spreader 520. In some embodiments, heat spreader 520 may be a vapor chamber to account for the higher thermal resistance between heat-generating structure 501 and MEMS cooling system 510. Offsetting MEMS cooling system 510 from heat-generating structure 501 may allow for MEMS cooling system 510 to provide its cooling power despite a reduced thickness of the device in which it is incorporated.

Figure 5D:
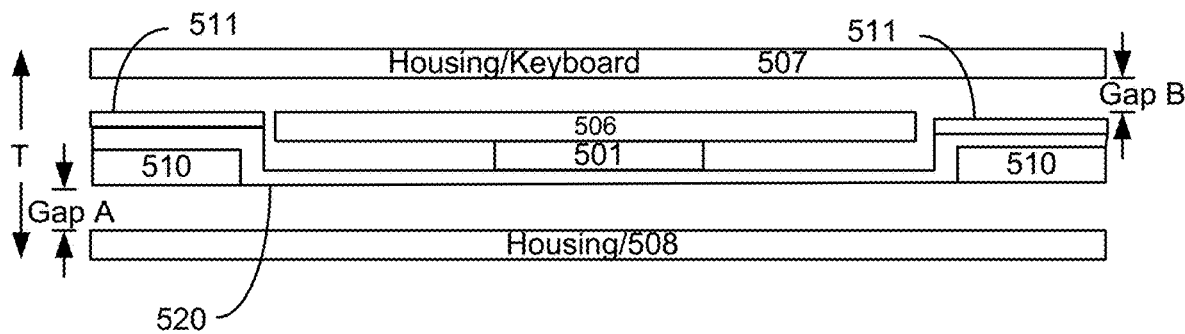

Referring to FIG. 5D, cooling system 500D and the device (e.g. a notebook computer or other portable computing device) into which it is incorporated are analogous to cooling systems 400, 500A, 500B, and 500C and the device housing cooling system 400 and 500A. The device into which cooling system 500D is integrated includes heat-generating structure 501 (e.g. a central processing unit), additional components (not shown), substrate 506, housing 507 (e.g. having a keyboard) and 508 (e.g. back cover) that are analogous to heat-generating structure 401/501, additional components 402/502 and 403/503, substrate 406/506, and housing 407/507. During use, heat-generating structure 501 may reach temperatures analogous to those described in the context of heat-generating structure 401. Although not shown, a TIM may be used to improve thermal coupling between heat-generating structure 501 and heat spreader 520 and/or MEMS cooling system 510.

Cooling system 500D includes two MEMS cooling systems 510, which are analogous to MEMS cooling system 510 depicted in FIG. 5A. Thus, each MEMS cooling system 510 may be a module analogous to module 395. In some embodiments, each MEMS cooling system 510 may include multiple modules 395. MEMS cooling systems 510 are offset from (i.e. not directly aligned with) heat-generating structure 501. However, MEMS cooling systems 510 are still thermally coupled with heat-generating structure 501 via heat spreader 520. For example, heat spreader 392 of module 395 of MEMS cooling system 510 may be coupled with heat spreader 520. In some embodiments, heat spreader 520 may be a vapor chamber to account for the higher thermal resistance between heat-generating structure 501 and MEMS cooling system 510. Offsetting MEMS cooling system 510 from heat-generating structure 501 may allow for MEMS cooling system 510 to provide its cooling power despite a reduced thickness of the device in which it is incorporated. Also shown in cooling system 500D is stage 511, to which heat spreader 520 and/or MEMS cooling system 510 may be mounted. In some embodiments, stage 511 is thermally conductive.

Also indicated in FIG. 5D are thickness, T, of the device, Gap A between heat spreader 520 and/or MEMS cooling systems 510 and housing 508, and Gap B between substrate 506 (or heat-generating device 501) and housing/keyboard 507. Gap A and Gap B may be desired in order to thermally insulate housing 507 and 508 from heat-generating structure 501 and heat spreader 520. Air is one of the best insulators. Consequently, Gap A and Gap b are generally desired to be airgaps. Adjusting the Gap A and Gap B between the hot spots and the housing/keyboard 507 and housing/back cover 508 may be a practical means of balancing the thermal resistance. Because air gap size affects the system pressure resistance, the thermal resistance balance must be considered with entrainment in mind. The added entrainment from the MEMS cooling systems 510A and 510, targets the skin hot spots (back cover and the keyboard) from inside the notebook. This results in lowering the skin temperature without lowering the vapor chamber/heat spreader 520 temperature. In some embodiments, air Gap A is desired to be not less than 800 micrometers thick in order for the temperature of back cover 508 to be less than 48° C. Air Gap B may be not less than one millimeter thick for housing/keyboard 507 to maintain a temperature of less than 42° C. In the embodiment shown in FIG. 5D, these gaps may be maintained for a device thickness T of nine millimeters. Further, air Gap A and air Gap B may be sufficiently large to allow for entrained flow of air through these gaps. The sizes and functions of air gaps analogous to Gap A and Gap B may be similar for other embodiments.

Figure 5E:
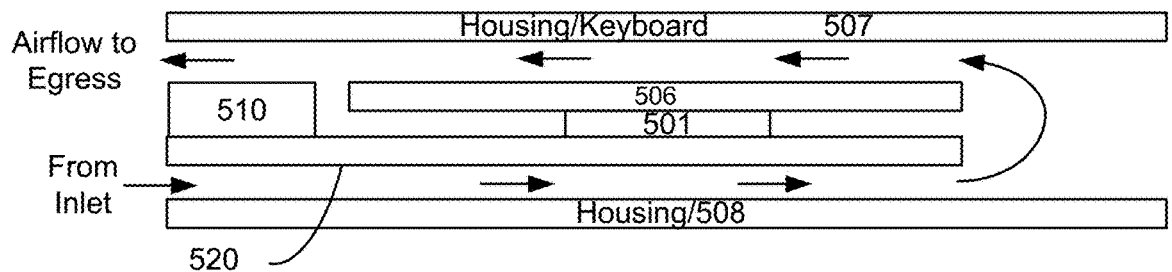

Referring to FIG. 5E, cooling system 500E and the device (e.g. a notebook computer or other portable computing device) into which it is incorporated are analogous to cooling systems 400, 500A, 500B, 500C, and 500D and the device housing cooling system 400 and 500A. The device into which cooling system 500E is integrated includes heat-generating structure 501 (e.g. a central processing unit), additional components (not shown), substrate 506, housing 507 (e.g. having a keyboard) and 508 (e.g. back cover) that are analogous to heat-generating structure 401/501, additional components 402/502 and 403/503, substrate 406/506, and housing 407/507. During use, heat-generating structure 501 may reach temperatures analogous to those described in the context of heat-generating structure 401. Although not shown, a TIM may be used to improve thermal coupling between heat-generating structure 501 and heat spreader 520 and/or MEMS cooling system 510. Heat spreader 520 may be a vapor chamber.

Cooling system 500E includes MEMS cooling system 510, which is analogous to MEMS cooling system 510 depicted in FIG. 5A. Thus, MEMS cooling system 510 may be a module analogous to module 395. In some embodiments, MEMS cooling system 510 may include multiple modules 395. MEMS cooling system 510 and heat-generating structure 501 are thermally coupled to heat spreader 520. In cooling system 500E, heat spreader 520 may be substantially flat. In addition, MEMS cooling system 510 is mounted such that the heated air leaves MEMS cooling system 510 in the direction of keyboard 507. The inlets to the device housing MEMS cooling system 510 may be between the back cover (e.g. a vent in a surface that is not shown in FIG. 5E or a vent in housing 508) and heat spreader 520. Thus, cooler air flows between heat spreader 520 and housing 508. Heated air from MEMS cooling system 510 flows between keyboard 507 and MEMS cooling system 510 to an egress. Cooler air, at least some of which may be entrained, thus flows over a number of components of the device. As such, cooling may be improved.

Figure 5F:
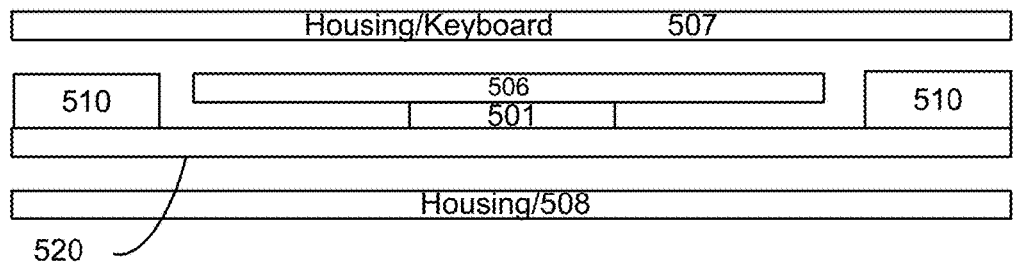

Referring to FIG. 5F, cooling system 500F and the device (e.g. a notebook computer or other portable computing device) into which it is incorporated are analogous to cooling systems 400, 500A, 500B, 500C, 500D, and 500E and the device housing cooling system 400 and 500A. The device into which cooling system 500F is integrated includes heat-generating structure 501 (e.g. a central processing unit), additional components (not shown), substrate 506, housing 507 (e.g. having a keyboard) and 508 (e.g. back cover) that are analogous to heat-generating structure 401/501, additional components 402/502 and 403/503, substrate 406/506, and housing 407/507. During use, heat-generating structure 501 may reach temperatures analogous to those described in the context of heat-generating structure 401. Although not shown, a TIM may be used to improve thermal coupling between heat-generating structure 501 and heat spreader 520 and/or MEMS cooling system 510. Heat spreader 520 may be a vapor chamber.

Cooling system 500F is analogous to cooling system 500E. In particular, the locations of inlets and egresses may be analogous to those for cooling system 500E. Thus, air enters the device of cooling system 500F and travels between housing 508 and heat spreader 520. MEMS cooling system 510 is mounted such that the heated air leaves MEMS cooling system 510 in the direction of keyboard 507. Heated air from MEMS cooling system 510 flows between keyboard 507 and MEMS cooling system 510 to an egress.

Further, cooling system 500E includes two MEMS cooling systems 510. MEMS cooling systems 510 are offset from (i.e. not directly aligned with) heat-generating structure 501. Offsetting MEMS cooling systems 510 from heat-generating structure 501 may allow for MEMS cooling system 510 to provide its cooling power in a device having a reduced thickness.

Cooling systems 500A, 500B, 500C, 500D, 500E, and 500F may improve thermal management of the device(s) in which cooling systems 500A, 500B, 500C, 500D, 500E, and 500F are incorporated. MEMS cooling systems 510 may provide efficient cooling in a low profile package. Further, entrainment provided via egress passageway 530 may provide higher flow and greater cooling. In addition, fluid used in cooling the device exits the device at a lower temperature. For example, fluid exiting egress 550 may be 50-55 degrees Celsius in some cases. Thus, the fluid is less likely to cause discomfort to or burn a user. Thus, performance of devices incorporating cooling systems 500A, 500B, 500C, 500D, 500E and/or 500F may be improved.

FIGS. 6-11 depict embodiments of systems 600, 700, 800, 900, 1000, and 1100 that utilize cooling systems analogous to systems 100, 200, 300, 395, 400, 500A, 500B, 500C, and/or 500D. In some embodiments, the devices integrate the cooling systems (e.g. module 395 and/or MEMS cooling systems 510) in order to utilize entrainment for cooling. In some embodiments, cooling systems 600, 700, 800, 900, 1000, and/or 1100 may produce entrained flow of greater than 1 cfm and a total flow (i.e. the flow that enters and exits the device) of greater than 1.5 cfm. For example, in some embodiments, entrained flows of 1.3 cfm and total flows of 2 cfm may be achieved. Thus, although the direct flow through a module such as module 395 may be on the order of 0.35 cfm, the entrained flow may be greater than the direct flow. Thus, entrained flow may significantly increase the cooling provided and allow for an improvement in maximum steady power of the device. In general, to improve entrained flow, inlets are located distal from the cooling modules (e.g. module 395). For example, the inlets may be not in a direct line (e.g. in the keyboard region or back cover) to the vents in the cooling module (e.g. vents 397). In some embodiments, side inlets are the primary inlets for flow entrained in system. A rear inlet (or other inlet) distal from the cooling module (e.g. module 395) may provide additional flow through the device. Egresses for such devices are generally in proximity to MEMS cooling system to provide an egress passageway with a lower resistance path for the heated air to leave the device. Such egress passageways may also allow for mixing of the heated air with cooler entrained air without significantly heating other components of the device. In some embodiments, egresses are desired to have an area that is of equal size or larger than the egresses of the cooling systems modules (e.g. not smaller than aperture 398.) In some embodiments the cool air entering the module/MEMS cooling system as part of the direct flow is desired to not mix with the heated air being driven to the egress(es). Thus, a gasket may be used on the side of MEMS cooling system proximate to the egresses. In some embodiments, the mixture of the hot air and the cool air at the egress(es) has a temperature not exceeding sixty degrees Celsius for the heat-generating structure being at least seventy degrees Celsius. In some such embodiments, the temperature does not exceed fifty-five degrees Celsius.

Figure 6:
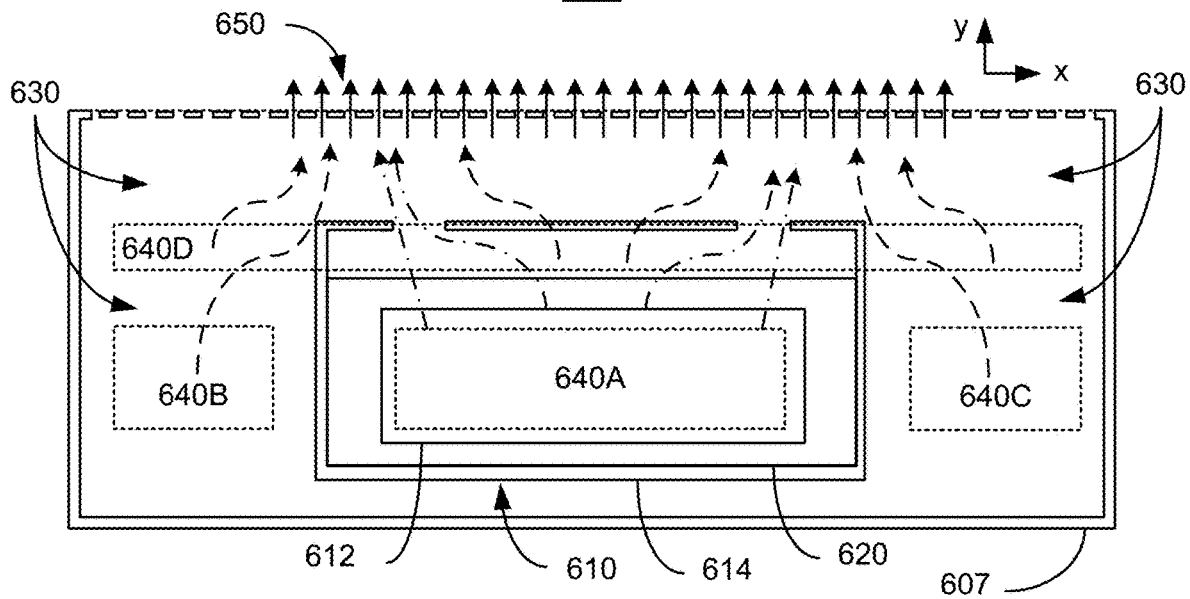
FIG. 6 depicts an embodiment of an active cooling system that utilizes entrainment integrated into a device.

FIG. 6 is a plan view of an embodiment of active cooling system 600 that utilizes entrainment integrated into a device. FIG. 6 is not to scale and for clarity, only some structures are shown. The device may be a laptop computer, a tablet or notebook computer, a smart phone, and/or other mobile device. Device may also be another device, such as a server in a rack, a game console, or a desktop computer. In some embodiments, therefore, the device is thin. For example, in some embodiments, the device has a thickness (height along the smallest dimension, perpendicular to the page in FIG. 6) analogous to those described for the devices of FIGS. 4 and 5A-5F.

Cooling system 600 and the device into which it is incorporated are analogous to cooling system(s) 400, 500A, 500B, 500C, 500D, 500E, and/or 500F and the device housing cooling MEMS system(s) 410 and/or 510. The device into which cooling system 600 is integrated includes heat-generating structure(s) (not shown) and housing 607 that are analogous to heat-generating structure 401 and 501 and housing 407 and 507/508. During use, the heat-generating structure cooled by system 600 may reach temperatures analogous to those described in the context of heat-generating structure(s) 401 and/or 501.

Cooling system 600 includes MEMS cooling system 610, heat spreader 620, egress passageway 630, inlets 640A, 640B, 640C, and 640D (collectively or generically 640), and egress 650 that are analogous to cooling system 410 and/or 510, heat spreader 420 and/or 520, egress passageway 430 and/or 530, inlets 440 and/or 540, and egress(es) 450 and/or 550, respectively. MEMS cooling system 610 includes cooling cells 612 (which are not individually denoted) and surrounding structure 614 which may be analogous to cooling cells 301, heat spreader 302, and cover plate 306. In some embodiments, heat spreader 620 may be omitted and/or may be part of structure 614 surrounding cooling cells 612. Although a single set of cooling cells 612 and surrounding structure 614 (e.g. a tile) is shown, multiple tiles may be present in some embodiments. Thus, MEMS cooling system 610 includes cooling element(s) configured to undergo vibrational motion when actuated to drive a fluid. Cooling cells 612 may also include top plate(s), anchor(s), orifice plate(s), and/or pedestal(s) analogous to those described in the context of cooling system 100 and/or 200. MEMS cooling system 610 may have a thickness analogous to those described for cooling systems 300, 395, 410 and/or 510.

Inlets 640A, 640B, 640C, and 640D and egress 650 allow for an exchange in fluid (e.g. air) internal to housing 607 with fluid external to the device. For example, inlets 640 and egress 650 may be vents. Although four inlets 640A, 640B, 640C, and 640D and one egress 650 are shown, in some embodiments, another number of inlet(s) and/or egress(es) may be present. For example, inlet 640D may be omitted, inlet 640D and one of inlets 640B and 640C may be omitted, or one or both of inlets 640B and 640C may be omitted. The function of inlets 640 and egress 650 are analogous to that of inlets 440 and 540 and egresses 450 and 550, respectively.

Cooling system 600 functions in a manner analogous to cooling system(s) 400, 500A, 500B, 500C, 500D, 500E, and/or 500F. Thus, cool fluid that enters the device via inlet 640A primarily flows through MEMS cooling system 610. The cool fluid may be the temperature of the ambient in which the device operates (e.g. 22-28 degrees Celsius). The cool fluid is driven via cooling cells 612 of MEMS cooling system 610. In so doing, heat is transferred from the heat-generating structure to the fluid. The heated fluid flows between portions of surrounding structure 614, toward egress 650. The flow of heated fluid is shown by dotted/dashed arrows. In some embodiments, the heated fluid exiting MEMS cooling system 610 has a temperature of at least sixty degrees Celsius. In some embodiments, the heated fluid exiting MEMS cooling system 610 is at least sixty-five degrees Celsius. In some embodiments, the heated fluid exiting MEMS cooling system 610 is at least seventy degrees Celsius.

The heated fluid driven by MEMS cooling system 610 travels at high speeds and may develop a low pressure, as discussed herein. Consequently, fluid is entrained into inlets 640B, 640C, and 640D. In the embodiment shown, fluid is entrained into inlets 640B and 640C even though inlets 640B and 640C are not between cooling cells 612 and egress 650. In the embodiment shown, the entrained fluid is from the ambient and thus may have a temperature similar to the fluid drawn into inlet 640A. The flow of cooler fluid through inlets 640B, 640C, and 640D is indicated by dashed arrows in FIG. 6. The flow of cool fluid through inlets 640B, 640C, and 640D as compared to the fluid flow from MEMS cooling system 610 is analogous to that described for cooling systems 410 and 510. For example, the fluid flow through inlets 640B, 640C, and 640D may be greater than the flow of fluid through MEMS cooling system 610.

Egress passageway 630 receives hot fluid from MEMS cooling system 610 and the cool fluid from inlets 640B, 640C, and 640D. The hot fluid from MEMS cooling system 610 mixes with the cooler fluid from inlet 640B in egress passageway 630. Thus, the hot fluid from MEMS cooling system 610 is cooled. The flow of the mixture of the heated fluid from MEMS cooling system 610 and cool fluid from inlets 640B, 640C, and 640D is shown by solid arrows in FIG. 6. The mixture of heated and cool fluid exits egress passageway via egress 650. Because cool fluid is mixed with hot fluid in egress passageway 630, the mixture of fluid exiting via egress 650 may have a significantly lower temperature than the hot fluid leaving MEMS cooling system 610. For example, the mixture of the hot air and the cool air at egress 650 may have a temperature(s) in the ranges described for egresses 430 and/or 530. In addition to cooling the hot fluid from MEMS cooling system 610, the cool air entrained through inlets 640B, 640C, and 640D may also be used to cool other components (not shown).

Cooling system 600 may improve thermal management of the device(s) in which cooling system 600 is incorporated. MEMS cooling system 610 may provide efficient cooling in a low profile package. Further, entrainment provided via egress passageway 630 may provide higher flow and greater cooling. In addition, fluid used in cooling the device exits the device at a lower temperature. For example, fluid exiting egress 650 may be 50-55 degrees Celsius in some cases. Thus, the fluid is less likely to cause discomfort to or burn a user. Thus, performance of devices incorporating cooling system 600 may be improved.

Figure 7:
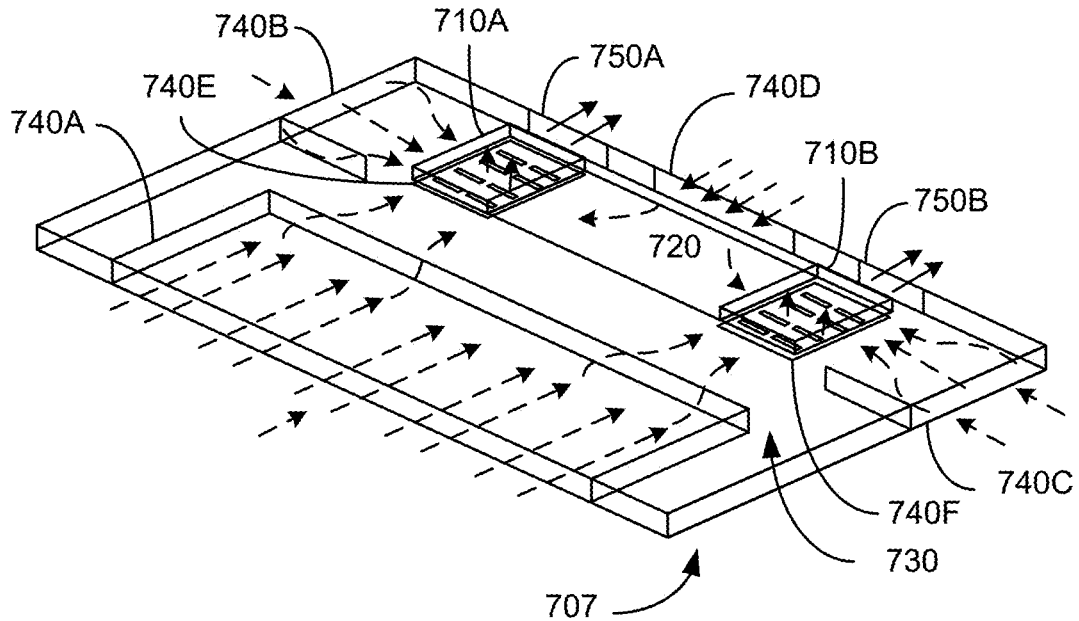
FIG. 7 depicts an embodiment of an active cooling system that utilizes entrainment integrated into a device.

FIG. 7 depicts a perspective view of an embodiment of active cooling system 700 that utilizes entrainment integrated into a device. FIG. 7 is not to scale and for clarity, only some structures are shown. The device may be a laptop computer, a tablet or notebook computer, a smart phone, and/or other mobile device. Device may also be another device, such as a server in a rack, a game console, or a desktop computer. In some embodiments, therefore, the device is dimension) analogous to those described for the devices of FIGS. 4 and 5A-5F.

Cooling system 700 and the device into which it is incorporated are analogous to cooling system(s) 400, 500A, 500B, 500C, 500D, 500E, 500F, and/or 600 and the device that houses cooling system(s) 410, 510 and/or 610. The device into which cooling system 700 is integrated includes heat-generating structure(s) (not shown) and housing 707 that are analogous to heat-generating structure 401 and 501 and housing 407 and 507/508. During use, the heat-generating structure cooled by system 700 may reach temperatures analogous to those described in the context of heat-generating structure(s) 401 and/or 501.

Cooling system 700 includes MEMS cooling systems 710A and 710B (collectively or generically 710), heat spreader 720, egress passageway 730, inlets 740A, 740B, 740C, 740D, 740E, and 740F (collectively or generically 740), and egresses 750A and 750B (collectively or generically 750) that are analogous to cooling system 410, 510 and/or 610, heat spreader 420 and/or 520, egress passageway 430, 530 and/or 630, inlets 440, 540 and/or 640, and egress(es) 450, 550, and/or 650, respectively. MEMS cooling systems 710 may each be analogous to cooling system (i.e. tile) 300. Each MEMS cooling system 710 may include cells, a heat spreader, and cover plate that are analogous to cells 301, heat spreader 302, and cover plate 306. In some embodiments, heat spreader 720 may be omitted. In some embodiments, the heat-generating structure may be thermally connected to heat spreader 720 (e.g. may be located near the center of heat spreader 720). Thus, the heat-generating structure may, but need not, be offset from MEMS cooling systems 710. MEMS cooling systems 710 include cooling elements configured to undergo vibrational motion when actuated to drive a fluid. MEMS cooling systems 710 may have a thickness analogous to those described for cooling systems 410 and 510.

Inlets 740 and egresses 750 allow for an exchange in fluid (e.g. air) internal to housing 707 with fluid external to the device. For example, inlets 740 and egresses 750 may be vents. Although six inlets 740 and two egresses 750 are shown, in some embodiments, another number of inlet(s) and/or egress(es) may be present. For example, in some embodiments, inlets 740E and 740F are omitted. In some embodiments, omission of inlets 740E and 740F is desired. In such embodiments, more flow may be drawn in through remaining inlets 740A, 740B, 740C, and/or 740D. In some embodiments, side inlets 740B and 740C are the primary inlets for flow entrained in system 700. Rear inlet 740A may be desired to provide additional flow through the device. Egresses 750 may be in proximity to MEMS cooling system 710. In some embodiments, egresses have an area that is of equal size or larger than the egresses of MEMS cooling systems 710 (e.g. not smaller than aperture 398.) In some embodiments the cool air entering MEMS cooling system 710 as part of the direct flow is desired to not mix with the heated air being driven to egresses 750. Thus, a gasket may be used on the side of MEMS cooling system 710 proximate to egresses 750. This high flow may be desirable for cooling the heat-generating structure that is thermally connected to heat spreader 720, for cooling other components (not shown), and/or for the blending and cooling of fluid exhaust. The function of inlets 740 and egresses 750 are analogous to that of inlets 440 and 540 and egresses 450 and 550, respectively.

Cooling system 700 functions in a manner analogous to cooling system(s) 400, 500A, 500B, 500C, 500D, 500E, 500F, and/or 600. Thus, cool fluid that enters the device via inlets 740E and 740F primarily flows through MEMS cooling systems 710A and 710B. The cool fluid may be the temperature of the ambient in which the device operates (e.g. 22-28 degrees Celsius). The cool fluid is driven via MEMS cooling systems 710. In so doing, heat is transferred from the heat-generating structure to the fluid. The heated fluid flows toward egresses 750A and 750B. In some embodiments, the heated fluid exiting MEMS cooling systems 710 has a temperature of at least sixty degrees Celsius.

In some embodiments, the heated fluid exiting MEMS cooling systems 710 is at least sixty-five degrees Celsius. In some embodiments, the heated fluid exiting MEMS cooling systems 710 is at least seventy degrees Celsius.

The fluid driven by MEMS cooling systems 710 travels at high speeds and may develop a low pressure in various portions of the device (e.g. in egress passageway 730). Although termed an "egress passageway", passageway 730 is between inlets 740 and egresses 750. Thus, egress passageway 730 is not only between the exit of MEMS cooling system 710 and egresses 750. Consequently, fluid is entrained into inlets 740A, 740B, 740C, and 740D. In the embodiment shown, the entrained fluid is from the ambient and thus may have a temperature similar to the fluid drawn into inlets 740E and 740F. The flow of cooler fluid through inlets 740A, 740B, 740C, and 740D is indicated by dashed arrows in FIG. 7. The flow of cool fluid through inlets 740A, 740B, 740C, and 740D as compared to the fluid flow from MEMS cooling systems 710 is analogous to that described for cooling systems 400, 500A, 500B, 500C, 500D, 500E, 500F, and/or 600. For example, the fluid flow through inlets 740A, 740B, 740C, and 740D that does not pass through MEMS cooling systems 710 may be greater than the flow of fluid through MEMS cooling systems 710.

Egress passageway 730 receives hot fluid from MEMS cooling systems 710 and the cool fluid from inlets 740A, 740B, 740C, and 740D. The hot fluid from MEMS cooling systems 710 mixes with the cooler fluid from inlet 740B in egress passageway 730. Thus, the hot fluid from MEMS cooling systems 710 is cooled. The flow of the mixture of the heated fluid from MEMS cooling systems 710 and cool fluid from inlets 740A, 740B, 740C, and 740D is shown by solid arrows in FIG. 7. The mixture of heated and cool fluid exits egress passageway via egresses 750. Because cool fluid is mixed with hot fluid in egress passageway 730, the mixture of fluid exiting via egresses 750 may have a significantly lower temperature than the hot fluid leaving MEMS cooling systems 710. For example, the mixture of the hot air and the cool air at egresses 750 may have a temperature(s) in the ranges described for egresses 430 and/or 530. In addition to cooling the hot fluid from MEMS cooling systems 710, the cool air entrained through inlets 740A, 740B, 740C, and 740D may also be used to cool other components (not shown).

Cooling system 700 may improve thermal management of the device(s) in which cooling system 700 is incorporated. MEMS cooling systems 710 may provide efficient cooling in a low profile package. Further, entrainment provided via egress passageway 730 may provide higher flow and greater cooling. In addition, fluid used in cooling the device exits the device at a lower temperature. For example, fluid exiting egresses 750 may be 50-55 degrees Celsius in some cases. Thus, the fluid is less likely to cause discomfort to or burn a user. Thus, performance of devices incorporating cooling system 700 may be improved.

Figure 8:
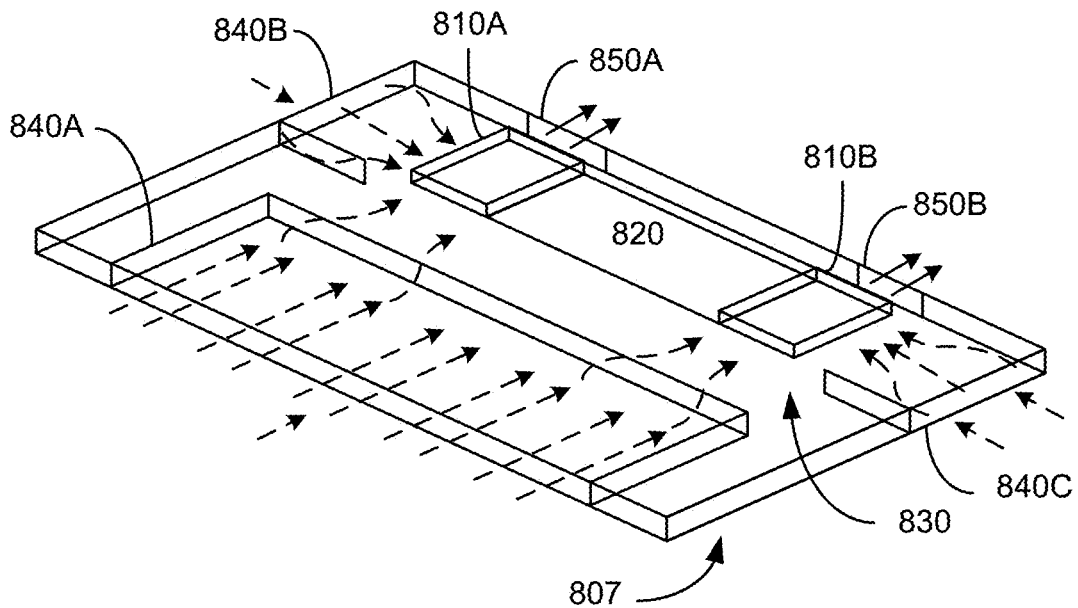
FIG. 8 depicts an embodiment of an active cooling system that utilizes entrainment integrated into a device.

FIG. 8 depicts a perspective view of an embodiment of active cooling system 800 that utilizes entrainment integrated into a device. FIG. 8 is not to scale and for clarity, only some structures are shown. The device may be a laptop computer, a tablet or notebook computer, a smart phone, and/or other mobile device. Device may also be another device, such as a server in a rack, a game console, or a desktop computer. In some embodiments, therefore, the device is dimension) analogous to those described for the devices of FIGS. 4 and 5A-5F.

Cooling system 800 and the device into which it is incorporated are analogous to cooling system(s) 400, 500A, 500B, 500C, 500D, 500E, 500F, 600 and/or 700 and the device that houses cooling system(s) 400, 500A, 500B, 500C, 500D, 500E, 500F, 600, and/or 700. The device into which cooling system 800 is integrated includes heat-generating structure(s) (not shown) and housing 807 that are analogous to heat-generating structure 401 and 501 and housing 407, 507/508, and/or 707. During use, the heat-generating structure cooled by system 800 may reach temperatures analogous to those described in the context of heat-generating structure(s) 401 and/or 501.

Cooling system 800 is most analogous to cooling system 700. Cooling system 800 includes MEMS cooling systems 810A and 810B (collectively or generically 810), heat spreader 820, egress passageway 830, inlets 840A, 840B, and 840C (collectively or generically 840), and egresses 850A and 850B (collectively or generically 850) that are analogous to MEMS cooling systems 710 (and thus 410, 510 and/or 610), heat spreader 720 (and thus heat spreader 420, 520 and/or 620), egress passageway 730 (and thus 430, 530, and/or 630), inlets 740 (and thus 440, 540, and/or 640), and egresses 750 (and thus 450, 550, and/or 650), respectively. However, cooling system 800 omits inlets that would be analogous to inlets 740E and 740F. As a result, cool air driven by MEMS cooling systems 810 is drawn in through the inlets 840. The absence of inlets under MEMS cooling systems 810 may increase the flow through inlets 840. A back inlet analogous to inlet 740D has also been omitted.

MEMS cooling systems 810 may each be analogous to cooling system 300. MEMS cooling system 810 may each include cells, a heat spreader and a cover plate that are analogous to cells 301, heat spreader 302, and cover plate 306. In some embodiments, heat spreader 820 may be omitted. In some embodiments, the heat-generating structure may be thermally connected to heat spreader 820 (e.g. may be located near the center of heat spreader 820). Thus, the heat-generating structure may, but need not, be offset from MEMS cooling systems 810. MEMS cooling systems 810 include cooling elements configured to undergo vibrational motion when actuated to drive a fluid. MEMS cooling systems 810 may have a thickness analogous to those described for cooling systems 410 and 510.

Inlets 840 and egresses 850 allow for an exchange in fluid (e.g. air) internal to housing 807 with fluid external to the device. For example, inlets 840 and egresses 850 may be vents. Although three inlets 840 and two egresses 850 are shown, in some embodiments, another number of inlet(s) and/or egress(es) may be present. Flow is drawn in through inlets 840A, 840B, and/or 840C. This high flow may be desirable for cooling the heat-generating structure that is thermally connected to heat spreader 820, for cooling other components (not shown), and/or for the blending and cooling of fluid exhaust. The function of inlets 840 and egresses 850 are analogous to that of inlets 740 and egresses 750, respectively.

Cooling system 800 functions in a manner analogous to cooling system(s) 400, 500A, 500B, 500C, 500D, 500E, 500F, 600 and/or 700. Cool fluid enters the device via inlets 840A, 840B, and 840C. Some of the flow is driven through MEMS cooling systems 810A and 810B. The cool fluid entering via inlets 840A, 840B, and 840C may be the temperature of the ambient in which the device operates (e.g. 22-28 degrees Celsius). The cool fluid is denoted by dashed arrows in FIG. 8. Some of this cool fluid is driven through MEMS cooling systems 810. In so doing, heat is transferred from the heat-generating structure to the fluid. The heated fluid flows toward egresses 850A and 850B. In some embodiments, the heated fluid exiting MEMS cooling systems 810 has a temperature of at least sixty degrees Celsius. In some embodiments, the heated fluid exiting MEMS cooling systems 810 is at least sixty-five degrees Celsius. In some embodiments, the heated fluid exiting MEMS cooling systems 810 is at least seventy degrees Celsius.

The fluid driven by MEMS cooling systems 810 travels at high speeds and may develop a low pressure, for example in egress passageway 830. Although termed an "egress passageway", passageway 830 is between inlets 840 and egresses 850. Thus, egress passageway 830 is not only between the exit of MEMS cooling system 810 and egresses 850. Consequently, fluid is entrained into inlets 840. Although some of the cool fluid entering via inlets 840 is driven by MEMS cooling systems 810, some of the entrained cool fluid does not pass through MEMS cooling systems 810. Some of the cool fluid cools other portions of the device and/or mixes with the hot fluid exiting MEMS cooling systems 810. The flow of cool fluid through inlets 840 that does not pass through MEMS cooling system 810 as compared to the fluid flow from MEMS cooling systems 810 is analogous to that described for cooling systems 400, 500A, 500B, 500C, 500D, 500E, and/or 500F. For example, the fluid flow through inlets 840 that does not pass through MEMS cooling systems 810 may be greater than the flow of fluid through MEMS cooling systems 810.

Egress passageway 830 receives hot fluid from MEMS cooling systems 810 and the cool fluid from inlets 840 that is not driven by MEMS cooling systems 810. The hot fluid from MEMS cooling systems 810 mixes with the cooler fluid in egress passageway 830. Thus, the hot fluid from MEMS cooling systems 810 is cooled. The flow of the mixture of the heated fluid from MEMS cooling systems 810 and cool fluid from inlets 840 is shown by solid arrows in FIG. 8. The mixture of heated and cool fluid exits egress passageway via egresses 850. Because cool fluid is mixed with hot fluid in egress passageway 830, the mixture of fluid exiting via egresses 850 may have a significantly lower temperature than the hot fluid leaving MEMS cooling systems 810. For example, the mixture of the hot air and the cool air at egresses 850 may have a temperature(s) in the ranges described for egresses 430 and/or 530.

Cooling system 800 may improve thermal management of the device(s) in which cooling system 800 is incorporated. MEMS cooling systems 810 may provide efficient cooling in a low profile package. Further, entrainment provided via egress passageway 830 may provide higher flow and greater cooling. In addition, fluid used in cooling the device exits the device at a lower temperature. For example, fluid exiting egresses 850 may be 50-55 degrees Celsius in some cases. Thus, the fluid is less likely to cause discomfort to or burn a user. Thus, performance of devices incorporating cooling system 800 may be improved.

Figure 9:
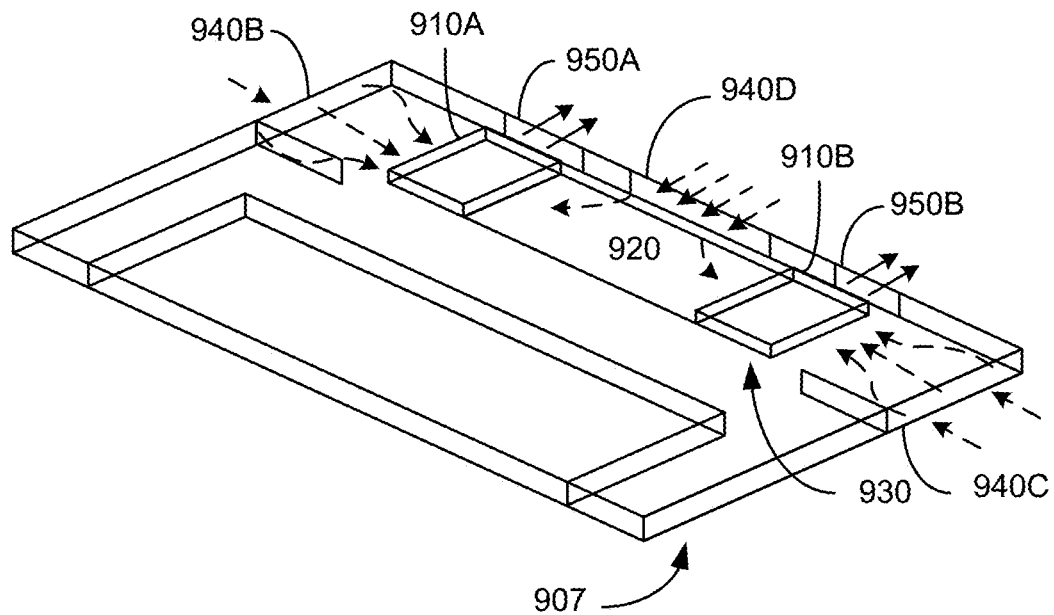
FIG. 9 depicts an embodiment of an active cooling system that utilizes entrainment integrated into a device.

FIG. 9 depicts a perspective view of an embodiment of active cooling system 900 that utilizes entrainment integrated into a device. FIG. 9 is not to scale and for clarity, only some structures are shown. The device may be a laptop computer, a tablet or notebook computer, a smart phone, and/or other mobile device. Device may also be another device, such as a server in a rack, a game console, or a desktop computer. In some embodiments, therefore, the device is dimension) analogous to those described for the devices of FIGS. 4 and 5A-5F.

Cooling system 900 and the device into which it is incorporated are analogous to cooling system(s) 400, 500A, 500B, 500C, 500D, 500E, 500F, 600, 700, and/or 800 and the device that houses cooling system(s) 400, 500A, 500B, 500C, 500D, 500E, 500F, 600, 700, and/or 800. The device into which cooling system 900 is integrated includes heat-generating structure(s) (not shown) and housing 907 that are analogous to heat-generating structure 401 and 501 and housing 407, 507/508, 707, and/or 807. During use, the heat-generating structure cooled by system 900 may reach temperatures analogous to those described in the context of heat-generating structure(s) 401 and/or 501.

Cooling system 900 is most analogous to cooling systems 700 and 800. Cooling system 900 includes MEMS cooling systems 910A and 910B (collectively or generically 910), heat spreader 920, egress passageway 930, inlets 940B, 940C, and 940D (collectively or generically 940), and egresses 950A and 950B (collectively or generically 950) that are analogous to MEMS cooling systems 710 and 810, heat spreader 720 and 820, egress passageway 730 and 830, inlets 740 and 840, and egresses 750 and 850, respectively. However, cooling system 900 omits inlets that would be analogous to inlets 740E and 740F. As a result, cool air driven by MEMS cooling systems 910 is drawn in through the inlets 940. The absence of inlets under MEMS cooling systems 910 may increase the flow through inlets 940. A front inlet analogous to inlet 740A has also been omitted.

MEMS cooling systems 910 may each be analogous to cooling system 300. MEMS cooling system 910 may each include cells, a heat spreader and a cover plate that are analogous to cells 301, heat spreader 302, and cover plate 306. In some embodiments, heat spreader 920 may be omitted. In some embodiments, the heat-generating structure may be thermally connected to heat spreader 920 (e.g. may be located near the center of heat spreader 920). Thus, the heat-generating structure may, but need not, be offset from MEMS cooling systems 910. MEMS cooling systems 910 include cooling elements configured to undergo vibrational motion when actuated to drive a fluid. MEMS cooling systems 910 may have a thickness analogous to those described for cooling systems 410 and 510.

Inlets 940 and egresses 950 allow for an exchange in fluid (e.g. air) internal to housing 907 with fluid external to the device. For example, inlets 940 and egresses 950 may be vents. Although three inlets 940 and two egresses 950 are shown, in some embodiments, another number of inlet(s) and/or egress(es) may be present. Flow is drawn in through inlets 940. This high flow may be desirable for cooling the heat-generating structure that is thermally connected to heat spreader 920, for cooling other components (not shown), and/or for the blending and cooling of fluid exhaust. The function of inlets 940 and egresses 950 are analogous to that of inlets 740 and 840 and egresses 750 and 850.

Cooling system 900 functions in a manner analogous to cooling system(s) 400, 500A, 500B, 500C, 500D, 500E, 500F, 600, 700 and/or 800. Cool fluid enters the device via inlets 940B, 940C, and 940D. Some of the flow is driven through MEMS cooling systems 910A and 910B. The cool fluid entering via inlets 940 may be the temperature of the ambient in which the device operates (e.g. 22-28 degrees Celsius). The cool fluid is denoted by dashed arrows in FIG. 9. Some of this cool fluid is driven through MEMS cooling systems 910. In so doing, heat is transferred from the heat-generating structure to the fluid. The heated fluid flows toward egresses 950A and 950B. In some embodiments, the heated fluid exiting MEMS cooling systems 910 has a temperature of at least sixty degrees Celsius. In some embodiments, the heated fluid exiting MEMS cooling systems 910 is at least sixty-five degrees Celsius. In some embodiments, the heated fluid exiting MEMS cooling systems 910 is at least seventy degrees Celsius.

The fluid driven by MEMS cooling systems 910 travels at high speeds and may develop a low pressure, for example in egress passageway 930. Although termed an "egress passageway", passageway 930 is between inlets 940 and egresses 950. Thus, egress passageway 930 is not only between the exit of MEMS cooling system 910 and egresses 950. Consequently, fluid is entrained into inlets 940. Although some of the cool fluid entering via inlets 940 is driven by MEMS cooling systems 910, some of the entrained cool fluid does not pass through MEMS cooling systems 910. Some of the cool fluid cools other portions of the device and/or mixes with the hot fluid exiting MEMS cooling systems 910. The flow of cool fluid through inlets 940 that does not pass through MEMS cooling system 910 as compared to the fluid flow from MEMS cooling systems 910 is analogous to that described for cooling systems 400, 500A, 500B, 500C, 500D, 500E, 500F, 600, 700, and/or 800. For example, the fluid flow through inlets 940 that does not pass through MEMS cooling systems 910 may be greater than the flow of fluid through MEMS cooling systems 910.

Egress passageway 930 receives hot fluid from MEMS cooling systems 910 and the cool fluid from inlets 940 that is not driven by MEMS cooling systems 910. The hot fluid from MEMS cooling systems 910 mixes with the cooler fluid in egress passageway 930. Thus, the hot fluid from MEMS cooling systems 910 is cooled. The flow of the mixture of the heated fluid from MEMS cooling systems 910 and cool fluid from inlets 940 is shown by solid arrows in FIG. 9. The mixture of heated and cool fluid exits egress passageway via egresses 950. Because cool fluid is mixed with hot fluid in egress passageway 930, the mixture of fluid exiting via egresses 950 may have a significantly lower temperature than the hot fluid leaving MEMS cooling systems 910. For example, the mixture of the hot air and the cool air at egresses 950 may have a temperature(s) in the ranges described for egresses 430 and/or 530.

Cooling system 900 may improve thermal management of the device(s) in which cooling system 900 is incorporated. MEMS cooling systems 910 may provide efficient cooling in a low profile package. Further, entrainment provided via egress passageway 930 may provide higher flow and greater cooling. In addition, fluid used in cooling the device exits the device at a lower temperature. For example, fluid exiting egresses 950 may be 50-55 degrees Celsius in some cases. Thus, the fluid is less likely to cause discomfort to or burn a user. Thus, performance of devices incorporating cooling system 900 may be improved.

Figure 10A:
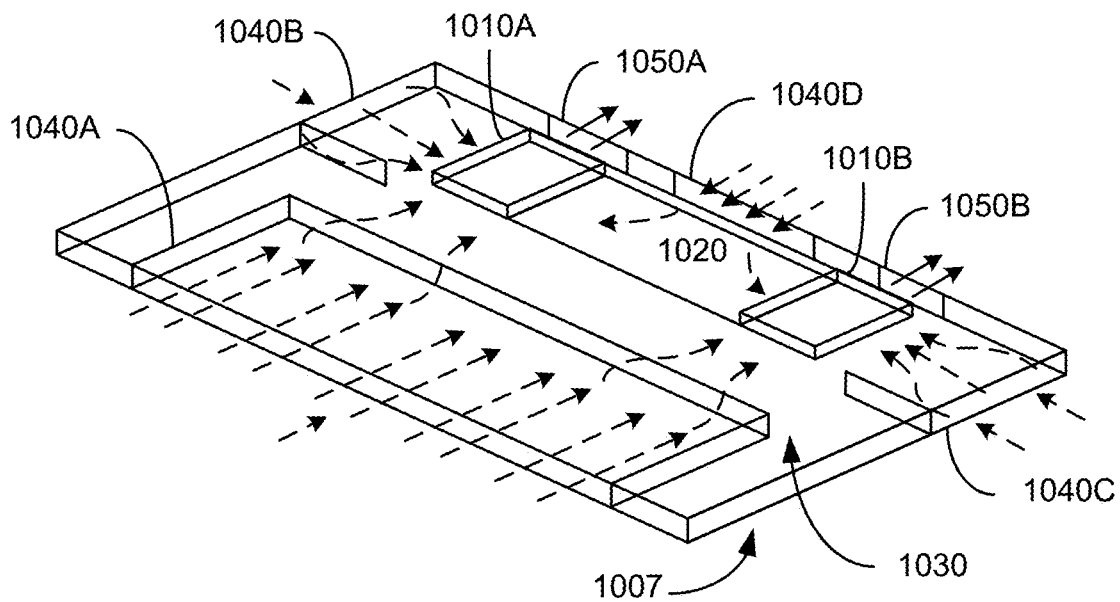
FIGS. 10A-10B depict an embodiment of an active cooling system that utilizes entrainment integrated into a device.
Figure 10B:
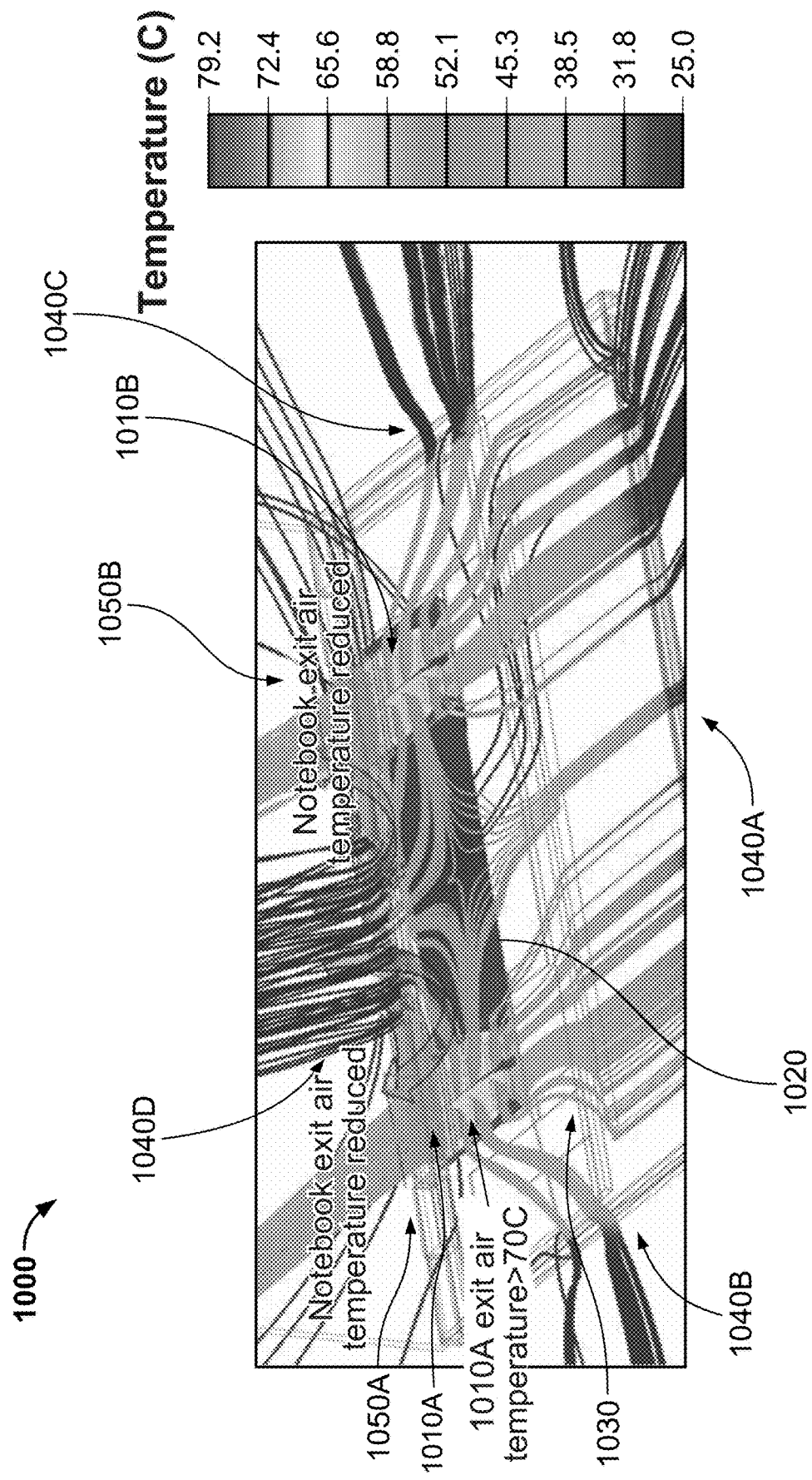

FIGS. 10A-10B depict perspective views of an embodiment of active cooling system 1000 that utilizes entrainment integrated into a device. FIGS. 10A and 10B are not to scale and for clarity, only some structures are shown. FIG. 10A depicts fluid flow generally, while FIG. 10B indicates the temperatures of fluid in various portions of the device. The device may be a laptop computer, a tablet or notebook computer, a smart phone, and/or other mobile device. Device may also be another device, such as a server in a rack, a game console, or a desktop computer. In some embodiments, therefore, the device is thin. For example, in some embodiments, the device has a thickness (height along the smallest dimension) analogous to those described for the devices of FIGS. 4 and 5A-5F.

Cooling system 1000 and the device into which it is incorporated are analogous to cooling system(s) 400, 500A, 500B, 500C, 500D, 500E, 500F, 600, 700, 800, and/or 900 and the device that houses cooling system(s) 400, 500A, 500B, 500C, 500D, 500E, 500F, 600, 700, 800, and/or 900. The device into which cooling system 1000 is integrated includes heat-generating structure(s) (not shown) and housing 1007 that are analogous to heat-generating structure 401 and 501 and housing 407, 507/508, 707, 807, and/or 907. During use, the heat-generating structure cooled by system 1000 may reach temperatures analogous to those described in the context of heat-generating structure(s) 401 and/or 501.

Cooling system 1000 is most analogous to cooling systems 700, 800 and 900. Cooling system 1000 includes MEMS cooling systems 1010A and 1010B (collectively or generically 1010), heat spreader 1020, egress passageway 1030, inlets 1040A, 1040B, 1040C, and 1040D (collectively or generically 1040), and egresses 1050A and 1050B (collectively or generically 1050) that are analogous to MEMS cooling systems 710, 810 and 910; heat spreader 720, 820, and 920; egress passageway 730, 830 and 930; inlets 740, 840, and 940; and egresses 750, 850, and 950, respectively. However, cooling system 1000 omits inlets that would be analogous to inlets 740E and 740F. As a result, cool air driven by MEMS cooling systems 1010 is drawn in through the inlets 1040. The absence of inlets under MEMS cooling systems 1010 may increase the flow through inlets 1040.

MEMS cooling systems 1010 may each be analogous to cooling system 300. MEMS cooling system 1010 may each include cells, a heat spreader and a cover plate that are analogous to cells 301, heat spreader 302, and cover plate 306. In some embodiments, heat spreader 1020 may be omitted. In some embodiments, the heat-generating structure may be thermally connected to heat spreader 1020 (e.g. may be located near the center of heat spreader 1020). Thus, the heat-generating structure may, but need not, be offset from MEMS cooling systems 1010. MEMS cooling systems 1010 include cooling elements configured to undergo vibrational motion when actuated to drive a fluid. MEMS cooling systems 1010 may have a thickness analogous to those described for cooling systems 410 and 510.

Inlets 1040 and egresses 1050 allow for an exchange in fluid (e.g. air) internal to housing 1007 with fluid external to the device. For example, inlets 1040 and egresses 1050 may be vents. Although four inlets 1040 and two egresses 1050 are shown, in some embodiments, another number of inlet(s) and/or egress(es) may be present. Flow is drawn in through inlets 1040. This high flow may be desirable for cooling the heat-generating structure that is thermally connected to heat spreader 1020, for cooling other components (not shown), and/or for the blending and cooling of fluid exhaust. The function of inlets 1040 and egresses 1050 are analogous to that of inlets 740, 840 and 940 and egresses 750, 850, and 950.

Cooling system 1000 functions in a manner analogous to cooling system(s) 400, 500A, 500B, 500C, 500D, 500E, 500F, 600, 700, 800 and/or 900. Cool fluid enters the device via inlets 1040A, 1040B, 1040C, and 1040D. Some of the flow is driven through MEMS cooling systems 1010A and 1010B. The cool fluid entering via inlets 1040 may be the temperature of the ambient in which the device operates (e.g. 22-28 degrees Celsius). The cool fluid is denoted by dashed arrows in FIG. 10A. Some of this cool fluid is driven through MEMS cooling systems 1010. In so doing, heat is transferred from the heat-generating structure to the fluid. The heated fluid flows toward egresses 1050A and 1050B. In some embodiments, the heated fluid exiting MEMS cooling systems 1010 has a temperature of at least sixty degrees Celsius. In some embodiments, the heated fluid exiting MEMS cooling systems 1010 is at least sixty-five degrees Celsius. In some embodiments, the heated fluid exiting MEMS cooling systems 1010 is at least seventy degrees Celsius.

The fluid driven by MEMS cooling systems 1010 travels at high speeds and may develop a low pressure, for example in egress passageway 1030. Although termed an "egress passageway", passageway 1030 is between inlets 1040 and egresses 1050. Thus, egress passageway 1030 is not only between the exit of MEMS cooling system 1010 and egresses 1050. Consequently, fluid is entrained into inlets 1040. Although some of the cool fluid entering via inlets 1040 is driven by MEMS cooling systems 1010, some of the entrained cool fluid does not pass through MEMS cooling systems 1010. Some of the cool fluid cools other portions of the device and/or mixes with the hot fluid exiting MEMS cooling systems 1010. The flow of cool fluid through inlets 1040 that does not pass through MEMS cooling system 1010 as compared to the fluid flow from MEMS cooling systems 1010 is analogous to that described for cooling systems 400, 500A, 500B, 500C, 500D, 500E, 500F, 600, 700, 800, and/or 900. For example, the fluid flow through inlets 1040 that does not pass through MEMS cooling systems 1010 may be greater than the flow of fluid through MEMS cooling systems 1010.

Egress passageway 1030 receives hot fluid from MEMS cooling systems 1010 and the cool fluid from inlets 1040 that is not driven by MEMS cooling systems 1010. The hot fluid from MEMS cooling systems 1010 mixes with the cooler fluid in egress passageway 1030. Thus, the hot fluid from MEMS cooling systems 1010 is cooled. The flow of the mixture of the heated fluid from MEMS cooling systems 1010 and cool fluid from inlets 1040 is shown by solid arrows in FIG. 10A. The mixture of heated and cool fluid exits egress passageway via egresses 1050. Because cool fluid is mixed with hot fluid in egress passageway 1030, the mixture of fluid exiting via egresses 1050 may have a significantly lower temperature than the hot fluid leaving MEMS cooling systems 1010. For example, the mixture of the hot air and the cool air at egresses 1050 may have a temperature(s) in the ranges described for egresses 430 and/or 530.

The temperatures of the fluid flowing through inlets 1040, egress passageway 1030, and egresses 1050 may also be seen in FIG. 10B. Cool fluid having the lower temperatures indicated enters the device via inlets 1040. The fluid is heated slightly as it traverses the interior of the device. However, the fluid is cooler than MEMS cooling systems 1010. At least some of the fluid from inlets 1040A, 1040B, and 1040C is driven through MEMS cooling systems 1010. As indicated in FIG. 10B, the temperature of fluid exiting MEMS cooling systems 1010 may be greater than seventy degrees Celsius. As indicated by arrows in FIG. 10B, some of the fluid entering via inlet 1040D returns directly toward egresses 1050, mixing with the hot fluid from MEMS cooling systems 1010. Some fluid from inlets 1040A, 1040B, and 1040C also mixes with the heated fluid from MEMS cooling systems 1010. Thus, the heated fluid is cooled. Fluid exiting egresses 1050 have a reduced temperature.

Cooling system 1000 may improve thermal management of the device(s) in which cooling system 1000 is incorporated. MEMS cooling systems 1010 may provide efficient cooling in a low profile package. Further, entrainment provided via egress passageway 1030 may provide higher flow and greater cooling. In addition, fluid used in cooling the device exits the device at a lower temperature. For example, fluid exiting egresses 1050 may be 50-55 degrees Celsius or less in some cases. Thus, the fluid is less likely to cause discomfort to or burn a user. Thus, performance of devices incorporating cooling system 1000 may be improved.

Figure 11:
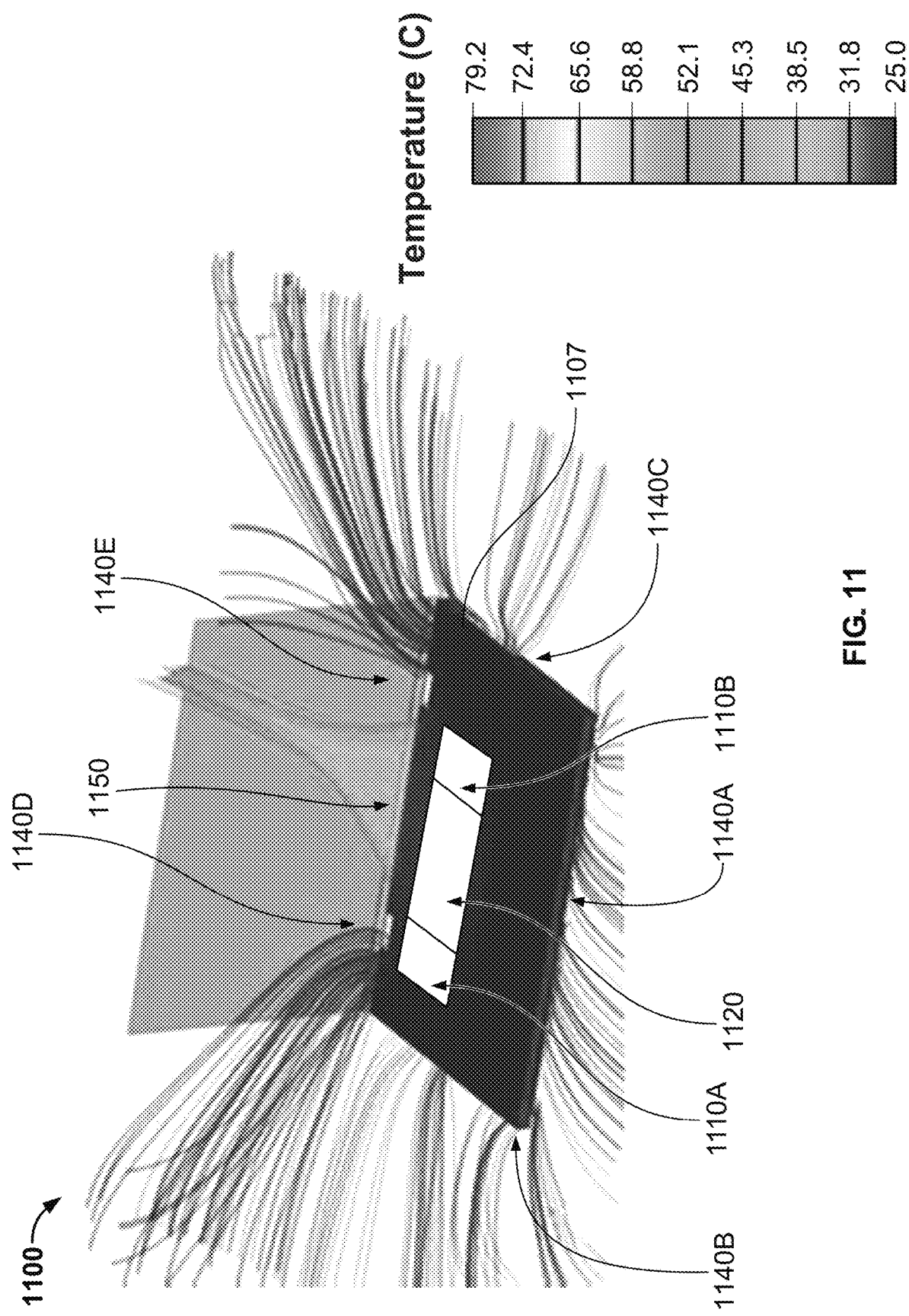
FIG. 11 depicts an embodiment of an active cooling system that utilizes entrainment integrated into a device.

FIG. 11 depicts an embodiment of active cooling system 1100 that utilizes entrainment integrated into a device. FIG. 11 IS not to scale and for clarity, only some structures are shown. FIG. 11 depicts fluid flow outside of the device and indicates the temperatures of the fluid device. The device may be a laptop computer, a tablet or notebook computer, a smart phone, and/or other mobile device. Device may also be another device, such as a server in a rack, a game console, or a desktop computer. In some embodiments, therefore, the device is thin. For example, in some embodiments, the device has a thickness (height along the smallest dimension) analogous to those described for the devices of FIGS. 4 and 5A-5F.

Cooling system 1100 and the device into which it is incorporated are analogous to cooling system(s) 400, 500A, 500B, 500C, 500D, 500E, 500F, 600, 700, 800, 900, and/or 1100 and the device that houses cooling system(s) 400, 500A, 500B, 500C, 500D, 500E, 500F, 600, 700, 800, 900, and/or 1000. The device into which cooling system 1100 is integrated includes heat-generating structure(s) (not shown) and housing 1107 that are analogous to heat-generating structure 401 and 501 and housing 407, 507/508, 707, 807, 907, and/or 1007. During use, the heat-generating structure cooled by system 1100 may reach temperatures analogous to those described in the context of heat-generating structure(s) 401 and/or 501.

Cooling system 1100 is most analogous to cooling systems 700, 800, 900 and 1000. Cooling system 1100 includes MEMS cooling systems 1110A and 1110B (collectively or generically 1110), heat spreader 1120, egress passageway 1130, inlets 1140A, 1140B, 1140C, 1140D, and 1140E (collectively or generically 1140), and a single egress 1150 (i.e. through a rear vent) that are analogous to MEMS cooling systems 710, 810 and 910; heat spreader 720, 820, and 920; egress passageway 730, 830 and 930; inlets 740, 840, and 940; and egresses 750, 850, and 950, respectively. However, cooling system 1100 omits inlets that would be analogous to inlets 740E and 740F, includes two rear inlets 1140D and 1140E, and includes a single egress 1150. As a result, cool air driven by MEMS cooling systems 1110 is drawn in through the inlets 1140. The absence of inlets under MEMS cooling systems 1110 may increase the flow through inlets 1140.

Cooling system 1100 functions in a manner analogous to cooling system 1000. Cool fluid is drawn in through inlets 1140. This high flow may be desirable for cooling the heat-generating structure that is thermally connected to heat spreader 1120, for cooling other components (not shown), and/or for the blending and cooling of fluid exhaust. The cool fluid entering via inlets 1140 may be the temperature of the ambient in which the device operates (e.g. 22-28 degrees Celsius). Some of this cool fluid is driven through MEMS cooling systems 1110. In so doing, heat is transferred from the heat-generating structure to the fluid. The heated fluid flows toward egress 1150. Cool fluid entering via inlets 1140 that is not driven through MEMS cooling systems 1110 may be used to cool other components, cool heat spreader 1120, and/or mix with the heated fluid exiting MEMS cooling systems 1110. Because cool fluid is mixed with hot fluid in egress passageway 1130, the mixture of fluid exiting via egresses 1150 may have a significantly lower temperature than the hot fluid leaving MEMS cooling systems 1110. For example, the mixture of the hot air and the cool air at egresses 1150 may have a temperature(s) in the ranges described for egresses 430 and/or 530.

Cooling system 1100 may improve thermal management of the device(s) in which cooling system 1100 is incorporated. MEMS cooling systems 1110 may provide efficient cooling in a low profile package. Further, entrainment provided via egress passageway 1130 may provide higher flow and greater cooling. In addition, fluid used in cooling the device exits the device at a lower temperature. For example, fluid exiting egresses 1150 may be 50-55 degrees Celsius or less in some cases. Thus, the fluid is less likely to cause discomfort to or burn a user. Thus, performance of devices incorporating cooling system 1100 may be improved.

Figure 12:
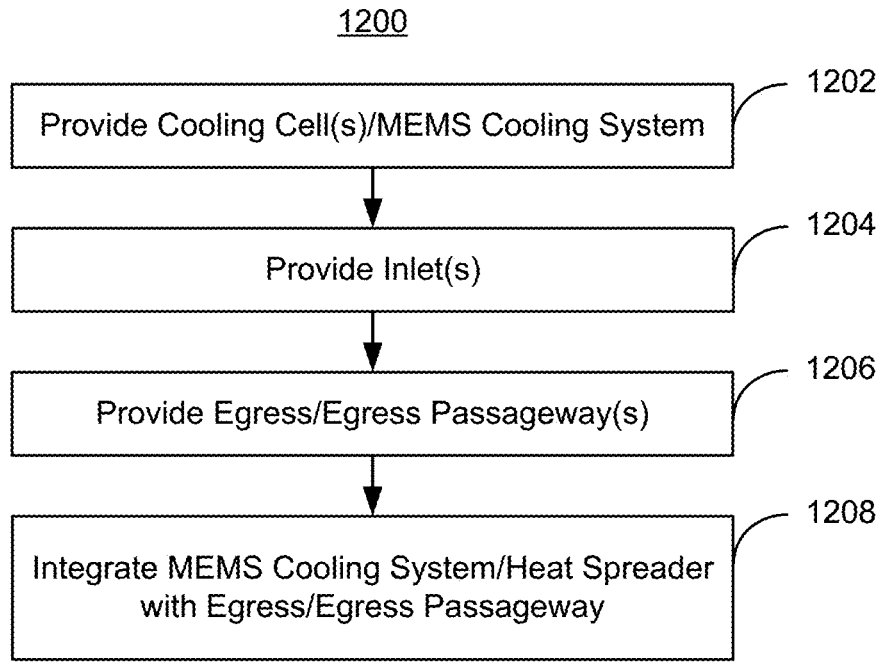
FIG. 12 depicts an embodiment of a method for providing an active cooling system that utilizes entrainment.

FIG. 12 depicts an embodiment of method 1200 for providing an active cooling system that utilizes entrainment. Method 1200 may include steps that are not depicted for simplicity. Method 1200 is described in the context of system 400. However, method 1200 may be used with other cooling systems including but not limited to systems 100, 200, 300, 500A, 500B, 500C, 500D, 500E, 500F, 600, 700, 800, 900, 1000 and/or 1100 and cells described herein. Method 1200 is also described in the context of forming a single system. However, method 1200 may be used to fabricate multiple systems substantially in parallel.

The MEMS cooling system is provided, at 1202. 1202 includes providing cooling element(s), top plate(s), orifice plate(s), pedestal(s), heat spreader(s), cover plate(s), and/or other portions of the MEMS cooling system. In some embodiments, multiple MEMS cooling systems are fabricated at 1202. The inlet(s) are provided, at 1204. In some embodiments, 1204 includes fabricating inlets in the device with which MEMS cooling system(s) are to be used. The egress(es) and egress passageways are provided, at 1206. In some embodiments, 1206 includes configuring portions of the device in which the MEMS cooling system(s) are incorporated.

The MEMS cooling system(s), inlet(s) egress passageway(s), are integrated into the device including heat-generating structure(s), at 1208.

For example, MEMS cooling system 410 may be provided, at 1202. Inlets 440A and 440B and egress 450 may be fabricated at 1204 and 1206, respectively. System 400 may be integrated into a computing or other device, at 1208. For example MEMS cooling system 400 may be attached to heat spreader 420 and aligned with inlet 440A. The distances between inlets 440, egress 450, and size of egress passageway 430 may also be configured. Thus, cooling system(s) 400, 500A, 500B, 500C, 500D, 500E, 500F, 600, 700, 800, 900, 1000 and/or 1100 may be provided and used in a device. Thus, the benefits described herein may be achieved.

Figure 13:
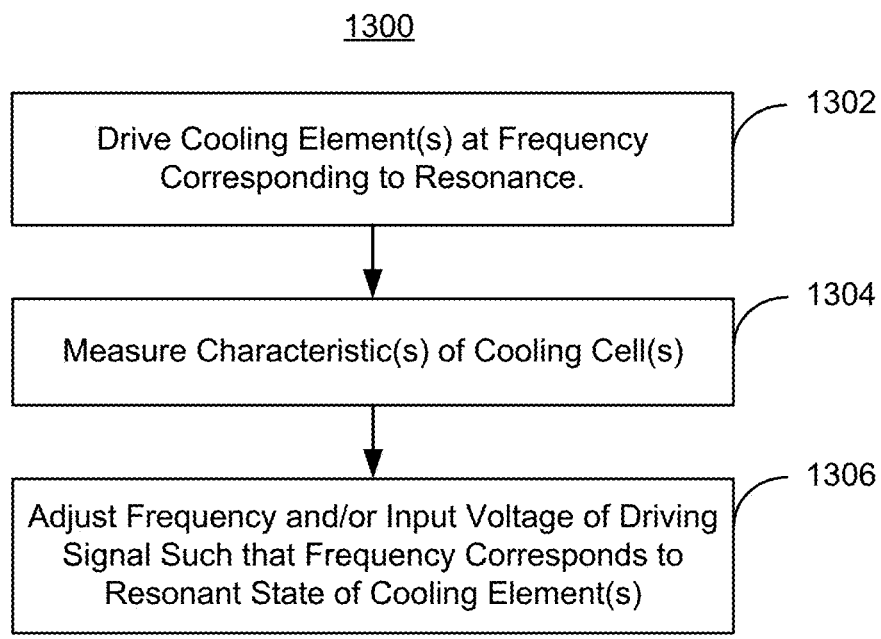
FIG. 13 depicts an embodiment of a method for using an active cooling system that utilizes entrainment.

FIG. 13 depicts an embodiment of method 1300 for using an active cooling system that utilizes entrainment. Method 1300 may include steps that are not depicted for simplicity. Method 1300 is described in the context of system 400. However, method 1300 may be used with other cooling systems including but not limited to systems and cells described herein.

A driving signal at a frequency and an input voltage corresponding to the resonant state of one or more cooling elements is provided to the active MEMS cooling system, at 1302. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above. The MEMS cooling system is utilized in conjunction with an egress passageway and egresses. Thus, activation of the MEMS cooling system at 1302 also entrains fluid into the device. This cooled fluid is mixed with heated fluid driven through the MEMS cooling system. Thus, the mixture of fluid leaving the egress has a reduced temperature. The entrained fluid may also be used to cool other components of the device.

Characteristic(s) of the MEMS cooling system are monitored while the cooling element(s) are driven to provide a feedback signal corresponding to a proximity to a resonant state of the cooling element(s), at 1304. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 1304. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the at cooling element, average voltage at the at least one cooling element, and/or the peak current drawn by the cooling element may be monitored. Using the characteristic(s) monitored, a deviation from the resonant state of the cooling element (e.g. of the driving/vibration frequency the deviation from the resonant frequency) may be determined.

The frequency and/or input voltage is adjusted based on the feedback signal, at 1306. More specifically, 1306 includes updating the frequency and/or input voltage, based on the feedback signal, to correspond to resonant state(s) of the cooling element(s) at 1306. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 1306 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling elements in MEMS cooling system 410 are driven, at 1302. Thus, the cooling elements in MEMS cooling system 410 are driven at a frequency that is at or near resonance for one or more of the cooling elements. Characteristics of the cooling elements within MEMS cooling system 410 are monitored, at 1304. Thus, the drift of the cooling element(s) from resonance may be determined. The frequency may be adjusted based on the monitoring of 1304, at 1306. Thus, MEMS cooling system 410 may be kept at or near resonance.

Thus, using method 1300, an active cooling system, such as cooling system(s) 100, 200, 300, 410, 510, 610, 710, 810, 910, 1010 and/or 1110 may be efficiently driven. These cooling systems may entrain fluid, which can be used to cool other components and/or the exhaust that egresses from the devices. Further, because the characteristic(s) of the MEMS cooling system are monitored, drifts in the resonant frequency may be discovered and accounted for. Thus, method 1300 may be used to operate active MEMS cooling systems and achieve the benefits described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a module including a plurality of cooling cells, a heat spreader, and a cover including a plurality of vents therein, the plurality of cooling cells being between the heat spreader and the cover, each of the plurality of cooling cells including a cooling element configured to draw air in through the plurality of vents and drive air out of an aperture between the heat spreader and the cover at a first flow rate, thereby providing a stream of hot air having been heated by a heat from a heat-generating structure thermally coupled to the heat spreader; and
an egress passageway through which the hot air passes toward an egress, wherein the egress passageway includes at least one inlet through which cool air is drawn at a second flow rate to be mixed with the hot air, the second flow rate being greater than the first flow rate.

2. The system of claim 1, wherein the cooling element undergoes vibrational motion to drive cooler air that is heated by the heat.

3. The system of claim 1, wherein the module has a thickness not exceeding three millimeters.

4. The system of claim 3, further comprising:
a housing having the at least one inlet therein, the housing having a vertical dimension, a first horizontal dimension, and a second horizontal dimensions, the vertical dimension being smaller than the first horizontal dimension and second horizontal dimensions, the module being vertically aligned with a portion of the housing, the at least one inlet being distal from the portion of the housing.

5. The system of claim 3, further comprising:
a housing including a keyboard and a back cover opposite from the keyboard, the module being at least one millimeter from the keyboard and at least 800 micrometers from the back cover.

6. The system of claim 3, wherein the aperture has an aperture area, the egress has an egress area, and the aperture area does not exceed the egress area.

7. The system of claim 1, wherein a mixture of the hot air and the cool air at the egress has a temperature not exceeding sixty degrees Celsius for the heat-generating structure being at least seventy degrees Celsius.

8. The system of claim 7, wherein the temperature does not exceed fifty-five degrees Celsius.

9. The system of claim 1, wherein the cooling element and the egress passageway are integrated into a computing device selected from a notebook computer, a laptop computer, and a smartphone.

10. The system of claim 1, wherein the module further includes:
a top plate having a plurality of vents therein, a top chamber being formed between the cooling element and the top plate for each of the plurality of cooling cells; and
an orifice plate having at least one orifice therein for each of the plurality of cooling cells, the cooling element being between the top plate and the orifice plate, the cooling element being actuated to drive air through the at least one orifice;
wherein the orifice plate, the cooling element, the top chamber, and the top plate have a combined height of not more than two millimeters.

11. A notebook computer, comprising:
a housing having at least one inlet and an egress therein;
a module residing in the housing, the module including a plurality of cooling cells, a heat spreader, and a cover including a plurality of vents therein, the plurality of cooling cells being between the heat spreader and the cover, each of the plurality of cooling cells including a cooling element configured to draw air in through the plurality of vents and drive air out of an aperture between the heat spreader and the cover at a first flow rate, thereby providing a stream of hot air having been heated by a heat from a heat-generating structure thermally coupled to the heat spreader; and
an egress passageway in the housing, cool air being drawn in the at least one inlet at a second flow rate to be mixed with the hot air, the second flow rate being greater than the first flow rate.

12. The notebook computer of claim 11, wherein the housing has a vertical dimension, a first horizontal dimension greater than the vertical dimension, and a second horizontal dimension greater than the vertical dimension, the vertical dimension not exceeding twenty millimeters.

13. The notebook computer of claim 11, wherein the aperture has an aperture area, the egress has an egress area, and the aperture area does not exceed the egress area.

14. The notebook computer of claim 13, wherein the egress is aligned with the aperture.

15. The notebook computer of claim 11, wherein a mixture of the hot air and the cool air at the egress has a temperature not exceeding fifty-five degrees Celsius for the heat-generating structure being at least seventy degrees Celsius.

16. The notebook computer of claim 12, wherein the module further includes:
a top plate having a plurality of vents therein, a top chamber being formed between the cooling element and the top plate for each of the plurality of cooling cells; and
an orifice plate having at least one orifice therein for each of the plurality of cooling cells, the cooling element being between the top plate and the orifice plate, the cooling element being actuated to drive air through the at least one orifice;
wherein the orifice plate, the cooling element, the top chamber, and the top plate have a combined height of not more than two millimeters.

17. A method, comprising:
driving a cooling element in each of a plurality of cooling cells to induce a vibrational motion at a frequency, the plurality of cooling cells being part of a module, the module further including a heat spreader, and a cover including a plurality of vents therein, the plurality of cooling cells being between the heat spreader and the cover, the vibrational motion drawing air in through the plurality of vents and driving the air out of an aperture between the heat spreader and the cover at a first flow rate, thereby providing a stream of hot air having been heated by a heat from a heat-generating structure thermally coupled to the heat spreader;

wherein the hot air passes through an egress passageway toward an egress, the egress passageway including at least one inlet through which cool air is drawn and provides a second flow rate to be mixed with the hot air, the second flow rate being greater than the first flow rate.

18. The method of claim 17, wherein the frequency corresponds to a structural resonant frequency of the cooling element and an acoustic resonant frequency for the cooling element.

19. The method of claim 17, wherein the module has a thickness not exceeding three millimeters.

20. The method of claim 17, wherein a mixture of the hot air and the cool air at the egress has a temperature not exceeding fifty-five degrees Celsius for the heat-generating structure being at least seventy degrees Celsius.

21. The system of claim 1, further comprising:
a housing having the module therein, the housing having a vertical dimension, a first horizontal dimension, and a second horizontal dimensions, the vertical dimension being smaller than the first horizontal dimension and second horizontal dimensions, the vertical dimension being not more than ten millimeters.

22. The notebook of claim 12, wherein the vertical dimension is not more than ten millimeters.

* * * * *